US011374024B2

(12) United States Patent
Lilak et al.

(10) Patent No.: US 11,374,024 B2
(45) Date of Patent: Jun. 28, 2022

(54) INTEGRATED CIRCUITS WITH STACKED TRANSISTORS AND METHODS OF MANUFACTURING THE SAME USING PROCESSES WHICH FABRICATE LOWER GATE STRUCTURES FOLLOWING COMPLETION OF PORTIONS OF AN UPPER TRANSISTOR

(71) Applicant: Intel Corporation, Santa Clara, CA (US)

(72) Inventors: Aaron D. Lilak, Beaverton, OR (US); Rishabh Mehandru, Portland, OR (US); Gilbert Dewey, Hillsboro, OR (US); Willy Rachmady, Beaverton, OR (US); Anh Phan, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 38 days.

(21) Appl. No.: 16/650,795

(22) PCT Filed: Dec. 27, 2017

(86) PCT No.: PCT/US2017/068565
§ 371 (c)(1),
(2) Date: Mar. 25, 2020

(87) PCT Pub. No.: WO2019/132893
PCT Pub. Date: Jul. 4, 2019

(65) Prior Publication Data
US 2020/0235134 A1    Jul. 23, 2020

(51) Int. Cl.
*H01L 27/12* (2006.01)
*H01L 21/822* (2006.01)
(Continued)

(52) U.S. Cl.
CPC ...... *H01L 27/1211* (2013.01); *H01L 21/8221* (2013.01); *H01L 21/823431* (2013.01);
(Continued)

(58) Field of Classification Search
CPC ............. H01L 27/1211; H01L 27/0688; H01L 21/8221; H01L 21/823431; H01L 25/0657; H01L 29/785
See application file for complete search history.

(56) References Cited

U.S. PATENT DOCUMENTS 9,012,326 B2    4/2015   Kim et al.
2005/0239242 A1  10/2005  Zhu et al.
(Continued)

FOREIGN PATENT DOCUMENTS

| KR | 20120021722 | 3/2012 | |
|---|---|---|---|
| WO | 2017111866 | 6/2017 | |
| WO | WO-2017111866 A1 * | 6/2017 | ......... H03K 19/0963 |

OTHER PUBLICATIONS

International Search Report and Written Opinion from PCT/US2017/068565 dated Sep. 21, 2018, 10 pgs.
(Continued)

*Primary Examiner* — Shaun M Campbell
(74) *Attorney, Agent, or Firm* — Essential Patents Group, LLP

(57) ABSTRACT

Integrated circuits with stacked transistors and methods of manufacturing the same are disclosed. An example integrated circuit includes a first transistor in a first portion of the integrated circuit, and a second transistor stacked above the first transistor and in a second portion of the integrated circuit above the first portion. The integrated circuit further includes a bonding layer between the first and second vertical portions of the integrated circuit. The bonding layer includes an opening extending therethrough between the (Continued)

first and second vertical portions of the integrated circuit. The integrated circuit also includes a gate dielectric on an inner wall of the opening.

19 Claims, 23 Drawing Sheets

(51) Int. Cl.
    *H01L 21/8234*     (2006.01)
    *H01L 25/065*     (2006.01)
    *H01L 27/06*     (2006.01)
    *H01L 29/78*     (2006.01)

(52) U.S. Cl.
    CPC ...... *H01L 25/0657* (2013.01); *H01L 27/0688* (2013.01); *H01L 29/785* (2013.01)

(56) References Cited

U.S. PATENT DOCUMENTS

| | | | | |
|---|---|---|---|---|
| 2008/0017934 A1* | 1/2008 | Kim | .................... | H01L 29/0657 257/401 |
| 2008/0191247 A1* | 8/2008 | Yin | .................... | H01L 21/8221 257/204 |
| 2009/0224330 A1* | 9/2009 | Hong | ...................... | H01L 27/11 257/368 |
| 2009/0224364 A1* | 9/2009 | Oh | ...................... | H01L 21/8221 257/532 |
| 2010/0140608 A1* | 6/2010 | Park | ...................... | H01L 29/785 257/43 |
| 2010/0190334 A1* | 7/2010 | Lee | .......................... | H01L 24/24 438/637 |
| 2012/0126883 A1 | 5/2012 | Juengling | | |
| 2013/0122672 A1* | 5/2013 | Or-Bach | ............... | H01L 21/845 438/199 |
| 2015/0061026 A1* | 3/2015 | Lin | ................. | H01L 21/823475 257/369 |
| 2016/0197069 A1* | 7/2016 | Morrow | ........... | H01L 21/76897 257/393 |
| 2016/0247887 A1* | 8/2016 | Jun | .................... | H01L 27/0688 |
| 2016/0336421 A1* | 11/2016 | Cheng | ................. | H01L 21/8221 |
| 2017/0358576 A1 | 12/2017 | Anderson et al. | | |

OTHER PUBLICATIONS

Extended European Search Report from European Patent Application No. 17935901.3 dated Jun. 29, 2021, 11 pgs.

\* cited by examiner

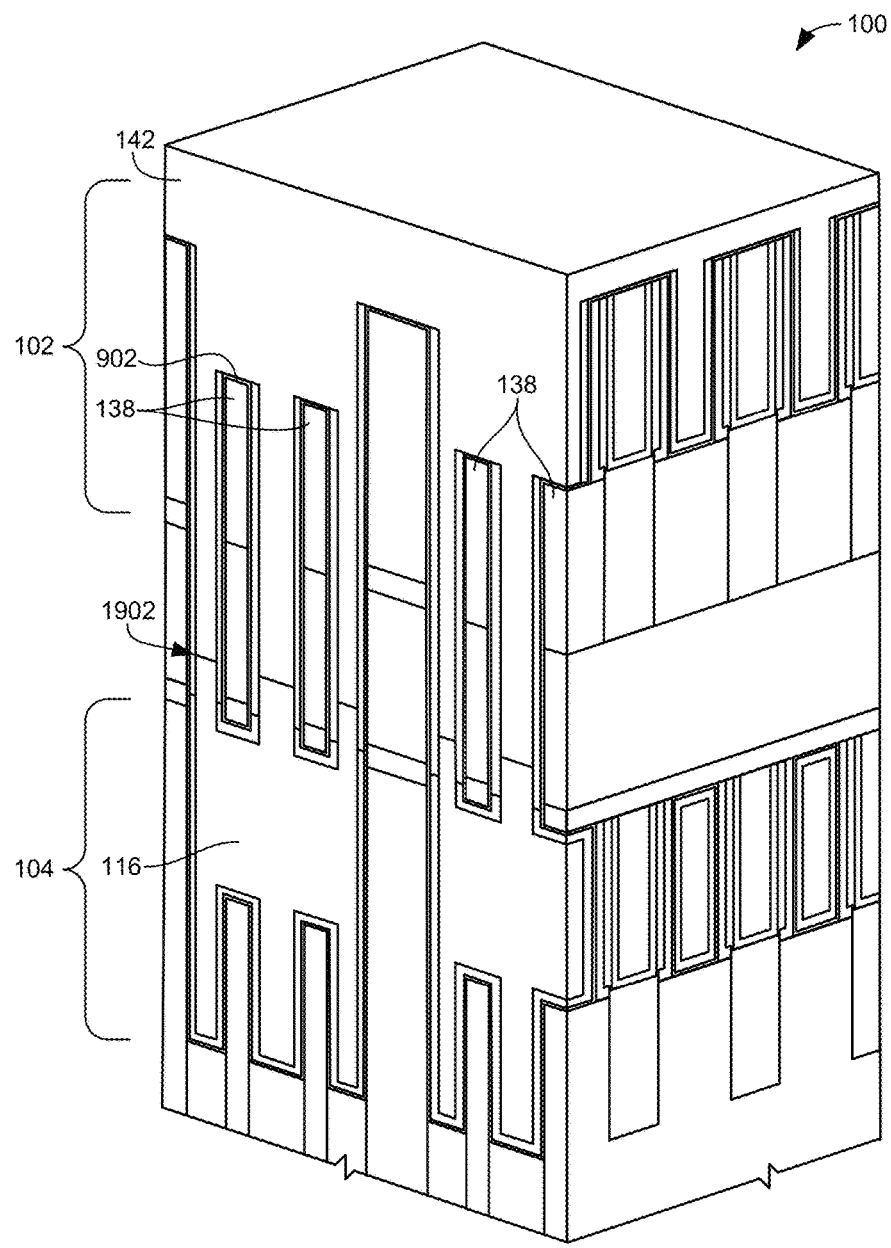 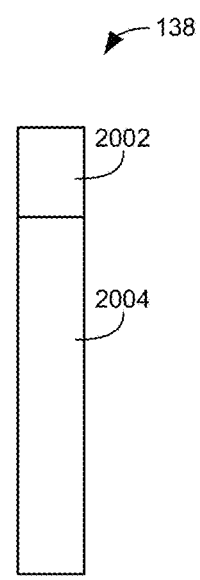
FIG. 19  FIG. 20

INTEGRATED CIRCUITS WITH STACKED TRANSISTORS AND METHODS OF MANUFACTURING THE SAME USING PROCESSES WHICH FABRICATE LOWER GATE STRUCTURES FOLLOWING COMPLETION OF PORTIONS OF AN UPPER TRANSISTOR

CLAIM OF PRIORITY

This Application is a National Stage Entry of, and claims priority to, PCT Application No. PCT/US2017/068565, filed on Dec. 27, 2017 and titled "INTEGRATED CIRCUITS WITH STACKED TRANSISTORS AND METHODS OF MANUFACTURING THE SAME USING PROCESSES WHICH FABRICATE LOWER GATE STRUCTURES FOLLOWING COMPLETION OF PORTIONS OF AN UPPER TRANSISTOR", which is incorporated by reference in its entirety for all purposes.

FIELD OF THE DISCLOSURE

This disclosure relates generally to semiconductor devices and, more particularly, to integrated circuits with stacked transistors and methods of manufacturing the same using processes which fabricate lower gate structures following completion of portions of upper transistor.

BACKGROUND

A general focus of research in the semiconductor industry involves the development of techniques that increase the number of transistors that can be formed on a single integrated circuit or chip. One approach that has been explored in recent years involves the stacking of transistors on top of one another.

BRIEF DESCRIPTION OF THE DRAWINGS

FIGS. 8-19 illustrate stages in an example method of manufacturing the example integrated circuit of FIG. 1.

FIG. 20 is a cross-sectional view of an example semiconductor fin in the example integrated circuit of FIGS. 1-19.

Figure 1:
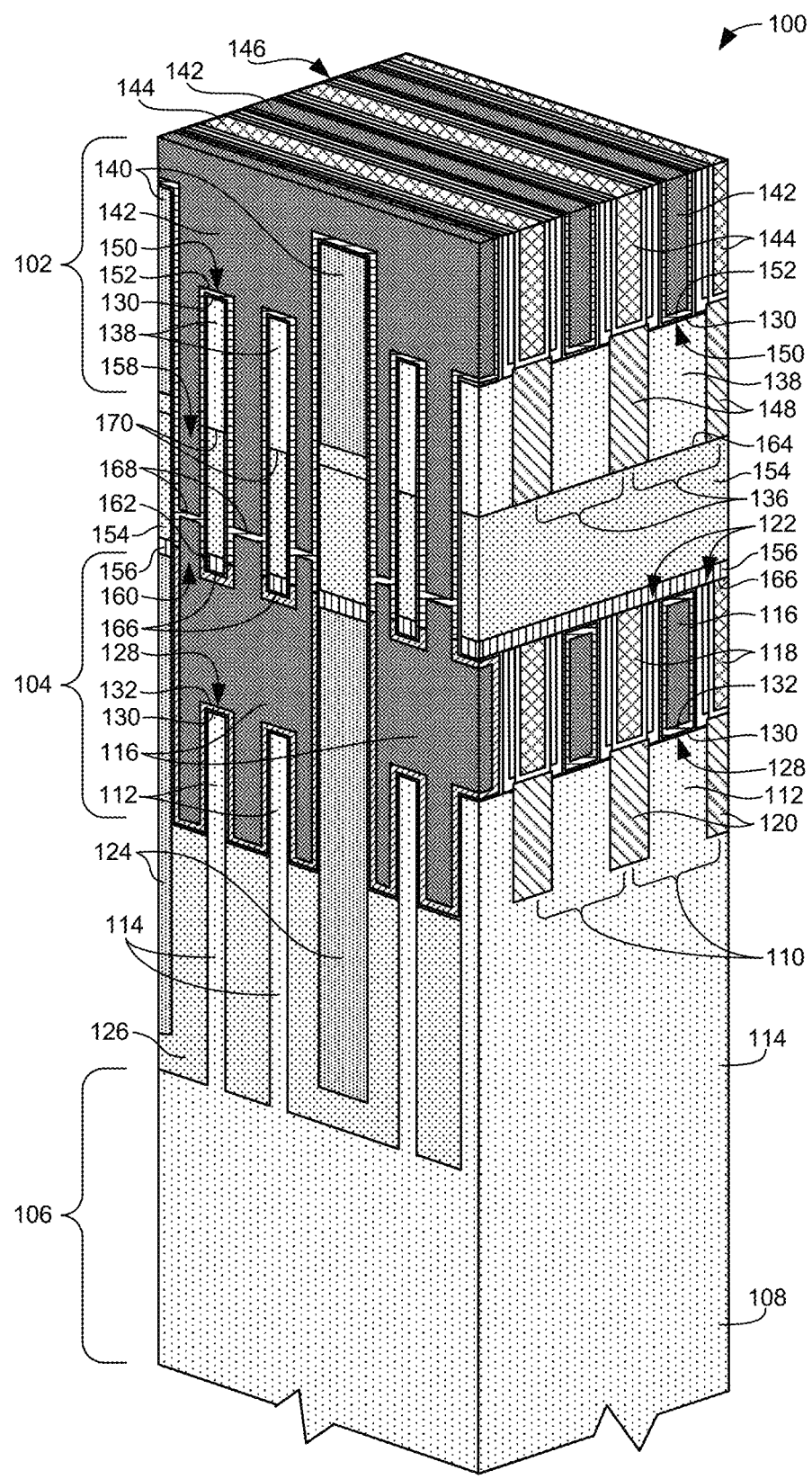
FIG. 1 is an isometric cut-away view of an example integrated circuit with stacked transistors constructed in accordance with teachings disclosed herein.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) or above another part, indicates that the referenced part is either in contact with the other part, or that the referenced part is above the other part with one or more intermediate part(s) located therebetween. Stating that any part is in contact with another part indicates that there is no intermediate part between the two parts.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, and (6) B with C.

DETAILED DESCRIPTION

Vertically stacking transistors offers the potential to significantly increase the number of transistors that may fit on a single integrated circuit when compared with a single layer of transistors. However, the vertical stacking of transistors presents certain challenges in that the processes used during the formation of an upper (stacked) transistor may deleteriously impact a previously formed lower transistor. For example, processing an upper transistor may cause the gate dielectric of a lower transistor to thicken or grow in an uncontrolled and/or unintended manner, which may degrade the performance of the lower transistor. The thickening or growth of the lower gate dielectric may arise due to the incorporation of oxygen or other impurities. Additionally, processing an upper transistor may affect the gate dielectric of a lower transistor by causing a work function shift resulting from diffusion within the gate stack. As used herein, the "gate stack" refers to the one or more layers of materials associated with the gate of a transistor that are deposited on a surface of a semiconductor material in which the gate, when energized, activates a channel between source and drain regions of a transistor. In some examples, the gate stack may be limited to a gate conductor and a gate dielectric positioned between the gate conductor and the semiconductor material. In other examples, the gate stack may include one or more additional layers other than the gate dielectric and the gate conductor.

Gate dielectric growth and/or work function shifts primarily occur during relatively high temperature processes (e.g., processes involving temperatures above 400 degrees Celsius). Accordingly, one approach to reduce these effects is to limit the thermal processes used while processing an upper transistor. While this approach may reduce the impact on the lower transistor of processing the upper transistor, it may not entirely eliminate such effects. Furthermore, the thermal limitations for the upper transistor may prevent the use of certain processes needed to take advantage of certain complementary metal-oxide-semiconductor (CMOS) technology and/or result in upper transistors with lower performance characteristics relative to transistors formed using higher temperature processes.

Examples disclosed herein overcome the above challenges by forming the gate stack (including the gate dielectric and the gate conductor) for both upper and lower transistors after otherwise completing the processing for the upper transistor. In such examples, the processing of the upper transistor cannot impact the gate stack because the gate stack has not yet been deposited during the fabrication of the upper transistor. Thus, there is no risk of the gate dielectric thickening or of a work function shift occurring during such fabrication processes. Furthermore, examples disclosed herein make relatively high temperature procedures available during the processing of the upper transistor that would otherwise be avoided because of thermal limitations.

FIG. 1 is an isometric cut-away view of an example integrated circuit 100 constructed in accordance with teachings disclosed herein. In the illustrated example, the integrated circuit 100 includes an upper transistor level 102 positioned above a lower transistor level 104. As used herein, the term "above" is used with reference to a bulk region 106 of a base semiconductor substrate 108 (e.g., a semiconductor wafer) on which components of the integrated circuit 100 are formed. Specifically, as used herein, a first component of the integrated circuit 100 is "above" a second component when the first component is farther away from the bulk region 106 of the semiconductor substrate 108. Likewise, as used herein, a first component is "below" another component when the first component is closer to the bulk region 106 of the semiconductor substrate 108. As noted above, one component can be above or below another with other components therebetween or while being in direct contact with one another. While two transistors levels are shown in the illustrated example, any suitable number of transistor levels may be stacked in accordance with the teachings disclosed herein.

In the illustrated example, the lower transistor level 104 includes an array of transistors 110 associated with top portions 112 of semiconductor fins 114 that extend upward from the bulk region 106 of the semiconductor substrate 108. In the illustrated example, the fins 114 have a rectangular shape. However, the teachings of this disclosure apply to fins with any other suitable shape including, for example, a trapezoidal shape, an hourglass shape, a teardrop shape, or for a nanowire or nanoribbon fin, etc. The semiconductor substrate 108 and the fins 114 may include any suitable semiconductor material such as, for example, silicon (Si), silicon germanium (SiGe), germanium (Ge), gallium arsenide (GaAs), etc. As shown in the illustrated example, multiple transistors 110 are formed along the length of each of the fins 114. Separate ones of the transistors 110 include separate gate contacts 116 positioned above a top surface and adjacent the sidewalls of the fins 114. The gate contacts 116 may include any suitable metal (e.g., one or more of aluminum (Al), copper (Cu), nickel (Ni), platinum (Pt), tungsten (W), titanium nitride (TiN), titanium (Ti), erbium (Er), cobalt (Co), platinum (Pt), etc.).

The transistors 110 in the lower transistor level 104 of FIG. 1 further include source and/or drain contacts 118 positioned on either side of the gate contacts 116 and above doped source and/or drain regions 120 in the top portion 112 of the fins 114. The source and drain contacts 118 may include any suitable metal (e.g., aluminum (Al), copper (Cu), tungsten (W), titanium (Ti), nickel (Ni), erbium (Er), cobalt (Co), platinum (Pt), or an alloy of multiple such metals, etc.). As shown in the illustrated example, the gate contacts 116 and the source and drain contacts 118 are separated by spacers 122 positioned therebetween. In some examples, as shown in FIG. 1, the spacers 122 include multiple layers of materials. The spacers 122 may include any suitable dielectric materials such as silicon dioxide, oxynitrides, metal oxides, carbon-doped oxides, fluorinated oxides or other materials.

In the illustrated example, the semiconductor fins 114 are arranged in pairs with isolation walls 124 formed between adjacent pairs of fins 114 with the same gate contact 116 extending over both fins 114. Thus, the arrangement shown in FIG. 1 is representative of the integrated circuit 100 implemented with two-fin semiconductor devices. However, other arrangements are possible. For instance, in some examples, fewer fins 114 (e.g., 1) or more fins (e.g., 3 or more) may be grouped between two isolation walls 124. In other examples, the isolation walls 124 may be omitted so that corresponding transistors 110 on many (e.g., all) of the fins 114 share the same gate contact 116. The isolation walls 124 may include any suitable dielectric material.

The space below the lower transistor level 104 between adjacent ones of the fins 114 and the isolation walls 124 is filled with a shallow trench isolation (STI) material 126. The STI material 126 may include any suitable dielectric material (e.g., silicon dioxide ($SiO_2$)).

As shown in FIG. 1, a gate stack 128 is deposited on the outer surfaces of the top portions 112 of the fins 114, the spacers 122, the isolation walls 124, and the STI material 126. Thus, the gate stack 128 is positioned between the material of the gate contacts 116 and the adjacent fins 114 (as well as separating the gate contacts 116 from the spacers 122, the isolation walls 124, and the STI material 126). In some examples, the gate stack 128 includes a thin layer (e.g., approximately 1 nanometer thick) of a gate dielectric 130 that is in direct contact with the fins 114, the spacers 122, the isolation walls 124, and the STI material 126. In some examples, this thin layer of dielectric may include a gate dielectric and a thin transition layer (such as silicon dioxide) which have a collective thickness of less than 2 nm to 5 nm in thickness. This thin transition layer is commonly used as a means of improving crystal quality at the interface between the transition layer and the surface of the semiconductor fins 114 beyond the quality which could be achieved with a process which utilized a direct interface between the gate dielectric 130 and the fins 114. In some examples, the gate dielectric 130 is a high-k dielectric. As used herein, a high-k dielectric is a material associated with a relative dielectric constant that is greater than 4. High-k materials include, for example, alumina ($Al_2O_3$), hafnia ($HfO_2$), zirconia ($ZrO_2$), silicon nitride ($Si_3N_4$), etc.

In the illustrated example, the gate stack 128 also includes additional gate stack materials 132 disposed on the gate dielectric 130. The additional gate stack materials 132 include a gate conductor including any suitable metal selected based on the work function to set threshold voltages for the transistors 110 based on the intended application of the devices. Example metals for the gate conductor include one or more of aluminum (Al), nickel (Ni), platinum (Pt), tungsten (W), titanium nitride (TiN), etc. In some examples, the additional gate stack materials may include one or more layers of work function metals, other metals, and/or other materials selected based upon the application for which the transistors 110 are to be used. For purposes of integration, the additional gate stack materials 132 will frequently include layers which are designed to reduce oxygen diffusion or to getter or stop the diffusion of oxygen (which may lead to thickening of the gate dielectric if it is allowed to diffuse through the gate stack). For instance, both PMOS and NMOS gate stacks may utilize a material such as Titanium Nitride with one of the devices having gate metal alloyed with a work function metal (e.g., Aluminum). There are many such permutations of a metal gate process which would be evident to one skilled in the art.

In the illustrated example, the upper transistor level 102 of the integrated circuit 100 is similar in structure to the lower transistor level 104. Thus, the upper transistor level 102 includes an array of transistors 136 associated with additional semiconductor fins 138 that are in vertical alignment with the fins 114 associated with the lower transistor level 104. For purposes of explanation, the transistors 136 and fins 138 in the upper transistor level 102 are referred to herein, respectively, as upper transistors 136 and upper fins 138. Further, the transistors 110 and fins 114 in the lower transistor level 104 are referred to herein, respectively, as lower transistors 110 and lower fins 114. As used herein, the term "vertical" is defined as extending in a direction orthogonally away from the bulk region 106 of the semiconductor substrate 108. Thus, the upper fins 138 being vertically aligned with the lower fins 114 means that corresponding upper fins 138 are above corresponding lower fins 114 and that both the upper and lower fins 114, 138 are oriented in a line extending normal to a plane defined by the semiconductor substrate 108. The upper fins 138 may include any suitable semiconductor material such as, for example, silicon (Si), germanium (Ge), gallium arsenide (GaAs), etc. While the upper fins 138 may include the same material as the lower fins 114, the lower and upper fins 114, 138 may alternatively include different semiconductor materials.

Additionally, as shown in the illustrated example, the upper transistor level 102 includes isolation walls 140 that are in vertical alignment with the isolation walls 124 in the lower transistor level 104. Thus, as shown in FIG. 1, the isolation walls 140 in the upper transistor level 102 divide the upper fins 138 into corresponding pairs for the implementation of two-fin devices. The isolation walls 140 in the upper transistor level 102 may include any suitable dielectric material.

In the illustrated example of FIG. 1, multiple upper transistors 136 are formed along the length of each of the upper fins 138 with alternating gate contacts 142 and source and drain contacts 144 with spacers 146 positioned therebetween. The source and drain contacts 144 are positioned above doped regions 148 within the upper fins 138, which may be in vertical alignment with the source and drain contacts 118 (and associated doped regions 120) in the lower transistor level 104 as shown in FIG. 1. In some examples, it may prove impossible to attain perfect vertical alignment due to process non-idealities and close alignment (defined as within 5 nm in either/both lateral directions) will be attained between the upper and lower contacts 144, 118.

The gate contacts 142 for the upper transistors 136 may include any suitable metal that is the same as or different than the gate contacts 116 for the lower transistors 110. Likewise, the source and drain contacts 144 may include any suitable metal that is the same as or different than the source and drain contacts 118 for the lower transistors 110. Similarly, the spacers 146 may be one or more layers of any suitable dielectric materials that are the same as or different than the spacers 122 for the lower transistors 110.

As shown in FIG. 1, a gate stack 150 is deposited on the outer surfaces of the upper fins 138, the isolation walls 140, and the spacers 146 in the upper transistor level 102. Thus, the gate stack 150 separates the gate contacts 142 and the upper fins 138 in the upper transistor level 102.

For purposes of explanation, the gate stack 150 associated with the upper transistor level 102 is referred to herein as the upper gate stack 150 and the gate stack 128 in the lower transistor level 104 is referred to herein as the lower gate stack 128. In some examples, the materials in the upper and lower gate stacks 128, 150 are different. In other examples, at least some layers of material in the upper gate stack 150 include the same materials as in the lower gate stack 128. More particularly, in some examples described more fully below, the upper gate stack 150 includes the same thin layer of the gate dielectric 130 in the upper transistor level 102 that was described above as being in the lower gate stack 128 of the lower transistor level 104. That is, in some examples, the gate dielectric 130 is a continuous layer of material that extends through both the upper and lower transistor levels 102, 104. Although the gate dielectric 130 may extend through both transistor levels 102, 104, in some examples, the upper transistor level 102 includes alternative and/or additional gate stack materials 152 (including a gate conductor metal) that are different than the additional gate stack materials 132 in the lower transistor level 104 which are chosen for purposes of tuning the work function/threshold voltage of the devices such as titanium nitride or titanium nitride alloyed with another work function metal such as Aluminum for instance. Whether the additional gate stack materials 132, 152 in the upper and lower transistor levels 102, 104 include similar or different materials may depend on the nature of the transistors 110, 136 formed in each level. For instance, in some examples, one of the upper or lower transistors 110, 136 may be p-type transistors while the transistors in the other level are n-type transistors. In such examples, the additional gate stack materials 132, 152 will include different materials. By contrast, in examples where both the upper and lower transistors 110, 136 have the same polarity (e.g., both p-type or both n-type), the additional gate stack materials 132, 152 associated with all of the transistors 110, 136 may be the same. In some such examples, the additional gate stack materials 132, 152 associated with the upper and lower gate stacks 128, 150 may be integrally formed to extend continuously through both the upper and lower transistor levels 102, 104.

In the illustrated example, the upper transistor level 102 is attached or bonded to the lower transistor level 104 via a bonding layer 154. More particularly, the bonding layer 154 is used to attach a block of semiconductor material 602 (FIG. 6) on to the surface of an etch stop layer 156 deposited on a top surface of the lower transistor level 104. The block of semiconductor material 602 is used to form the upper fins 138 and other features of the upper transistor level 102 described above.

As shown in the illustrated example of FIG. 1, the bonding layer 154 includes holes or openings 158 that extend through the bonding layer in vertical alignment with the spaces between the upper fins 138. Furthermore, the openings 158 in the bonding layer 154 are in vertical alignment with holes or openings 160 in the etch stop layer 156. It is through the openings 158, 160 that the gate dielectric 130 is able to extend continuously through both the upper and lower transistor levels 102, 104. Thus, as shown in the illustrated example, the gate dielectric 130 is deposited and extends along the inner walls of the openings 158, 160. Similarly, the additional gate stack materials 132, 152 of at least one of the lower gate stack 128 or the upper gate stack 150 are disposed adjacent the inner walls of the openings 158, 160. More particularly, in the illustrated example, an interface 162 of the additional gate stack materials 132, 152 associated with the upper and lower gate stacks 128, 150 is located adjacent the etch stop layer 156. Thus, in this example, the upper gate stack 150 extends down through the entire thickness of the bonding layer 154 and part of the thickness of the etch stop layer 156, while the lower gate stack 128 extends up the remaining portion of the etch stop layer 156 to the upper gate stack 150. In other examples, the interface 162 may be at a higher location such that the lower gate stack 128 extends up at least a portion of the thickness of the bonding layer 154. In some examples, the interface 162 may be located at or above the top surface 164 of the bonding layer 154 such that the lower gate stack 128 extends the entire thickness of both the etch stop layer 156 and the bonding layer 158. In other examples, the interface 162 may be located at or below a bottom surface 166 of the etch stop layer 156 such that the upper gate stack 150 extends the entire thickness of both the etch stop layer 156 and the bonding layer 158. In other examples, as mentioned above, the upper and lower gate stacks 128, 150 may be integrally formed such that there is no interface 162.

As shown in FIG. 1, the gate contacts 116, 142 associated with the upper and lower transistor levels 102, 104 extend into the openings 158, 160 of the bonding and etch stop layers 154, 156 to fill the space between opposing portions of the gate stacks 128, 150. In some examples, the gate contacts 116, 142 are electrically connected with one another through the openings 158, 160. In some examples, the upper and lower gate contacts 116, 142 are separated by bridges 168 in the openings 158, 160 between the opposing portions of the gate stack 128, 150. In this example, the bridges 168 are made of the additional gate stack material 152 of the upper gate stack 150 and provide electrical connectivity between the upper and lower gate contacts 116, 142. As shown in the illustrated example, the bridges 168 are positioned at a location within the thickness of the bonding layer 154. As a result, the gate contacts 142 of the upper transistor level 102 extend below a bottom surface 170 of the upper fins 138. In some examples, the bridge 168 in the openings 158, 160 may be omitted so that the upper and lower gate contacts are in direct contact, thereby improving their electrical connectivity. In some examples, the upper and lower gate contacts 116, 142 are integrally formed of the same material such that there are no bridges 168 or interface between the gate contacts for the upper and lower transistor levels 102, 104.

As described more fully below, the upper and lower gate stacks 128, 150 (including the gate dielectric 130 and the additional gate stack materials 132, 152) and the gate contacts 116, 142 are the last materials deposited in the example integrated circuit 100 up to the point of manufacture represented in FIG. 1. That is, the upper and lower gate stacks 128, 150 and the gate contacts 116, 142 are added after the upper transistor level 102 has been attached to the lower transistor level 104 via the bonding and etch stop layers 154, 156; after the openings 158, 160 have been etched through the bonding and etch stop layers 154, 156; and after the various features and structures of the upper transistor level 102 have been formed. In some examples, the etchstop layer 156 may be optional as would be apparent to one skilled in the art. This process order results in several structural differences in the example integrated circuit 100 of FIG. 1 when compared with other techniques used to stack transistors. For example, processing the gate materials (including both the gate stacks 128, 150 and the gate contacts 116, 142) at the end of the device fabrication process results in the materials of the upper and lower gate stacks 128, 150 extending (continuously or with an interface 162) through both the upper and lower transistor levels 102, 104 as well as coating the inner walls of the openings 158, 160 in the bonding and etch stop layers 154, 156. Furthermore, as shown in FIG. 1, processing the gate materials last also results in the lower gate stack 128 being deposited on the bottom surface 166 of the etch stop layer 156.

Additionally, in some examples, the gate stacks 128, 150 may be thinner and/or have different compositions than in other known ICs because the gate stacks 128, 150 may omit diffusion barriers and/or other layers/materials that would otherwise be needed if the gate materials were formed earlier in the manufacturing process. In some examples, the gate stacks 128, 150 do not include a diffusion barrier because there is relatively little risk of diffusion occurring when the gate stacks 128, 150 will not be exposed to the fabrication processes used to form the other structures of the upper transistor level 102. More particularly, diffusion barriers are commonly used to reduce (e.g., prevent) diffusion of oxygen and include the use of thin regions of sputtered silicon or undoped silicon or oxygen getterers within the gate stack. By forming the gate stack at the end of device fabrication as disclosed herein may obviate the need for such barriers, thereby resulting in the gate stack of the bottom device to include fewer layers of materials and be potentially 2-3 nm thinner than otherwise possible using known fabrication methods. As mentioned above, a challenge with known approaches to manufacturing stacked transistors is that fabrication processes (and particularly high temperature processes) associated with the upper transistor level can give rise to diffusion within the gate stack of the lower transistor level, which may cause a work function shift. However, if the gate stack has not yet been deposited in the lower transistor level, as disclosed herein, a shift in work function is not a concern. Another concern of existing approaches to stacking transistors is that fabrication processes (and particularly high temperature processes) associated with the upper transistor level can cause the gate dielectric of the lower transistor level to thicken or grow in an uncontrolled and/or unintended manner. However, if the gate dielectric has not yet been deposited in the lower transistor level when the upper transistor level is formed, as disclosed herein, gate dielectric growth is not a concern. Furthermore, by removing the risk of gate dielectric growth and/or a work function shift from occurring opens up the opportunity to use any suitable fabrication techniques regardless of their temperature requirements because temperature is not a concern before the gate materials are deposited.

FIG. 1 represents the completion of the fabrication of the structure of the stacked transistors 110, 136 during front-end-of-line processes. In some examples, additional processes may be implemented following the stage of fabrication represented by FIG. 1. For instance, in some examples, the top portion of the structure of the integrated circuit 100, as shown in FIG. 1, may be polished or planarized to a height below the top of the isolation walls 140 and above the top of the fins 114 (and associated gate stack 150). In this manner, the pairs of transistors 136 on either side of the isolation walls will be electrically insulated from one another in a similar manner is for the transistors 110 in the lower transistor level 104.

Figure 2:
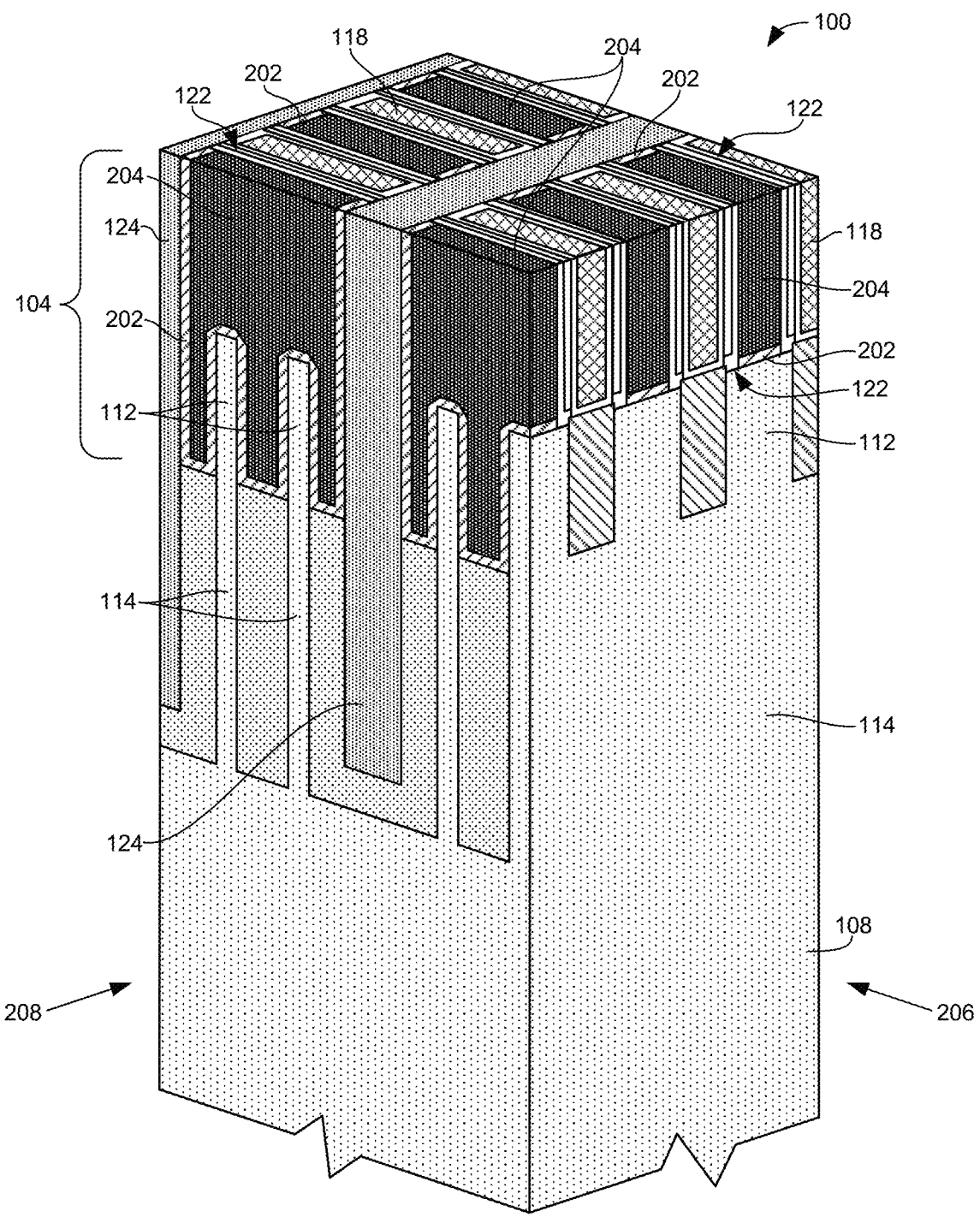
FIG. 2 is an isometric cut-away view of the lower transistor level of the example integrated circuit of FIG. 1 before an upper transistor level has been added.

FIGS. 2-18 illustrate example stages in an example method of manufacturing the example integrated circuit of FIG. 1. In particular, FIG. 2 illustrates the integrated circuit 100 of FIG. 1 after completion of the fabrication of the lower transistor level 104 but before the addition of the upper transistor level 102. The lower transistor level 104 at the stage of fabrication represented in FIG. 2 is structured substantially the same as the lower transistor level 104 when the integrated circuit 100 is completely manufactured as represented in FIG. 1. However, the lower transistor level 104 in FIG. 2 is different than in FIG. 1 in that, at the point in time represented in FIG. 2, the lower transistor level 104 includes a sacrificial gate dielectric 202 with a sacrificial gate conductor 204 deposited thereon. The gate dielectric 202 and the gate conductor 204 are sacrificial because they are to be removed and replaced by the lower gate stack 128 and the gate contacts 116 (as shown in FIG. 1) during subsequent processing as described below. The sacrificial gate dielectric 202 may include any suitable dielectric material such as silicon dioxide. In some examples, it may be the same material as used for the final gate dielectric 130 deposited later in the manufacturing process. In other examples, the material used for the sacrificial gate dielectric 202 may be different than what is used for the final gate dielectric 130 and selected to facilitate its subsequent removal. The sacrificial gate conductor 204 may include any suitable material. In some examples, the sacrificial gate conductor may be polysilicon. In some examples, it may be the same material as used for the final gate contacts 116 deposited later in the manufacturing process. In other examples, the sacrificial gate conductor 204 may be different than the final gate contacts 116 and selected to facilitate its subsequent removal.

Figure 3:
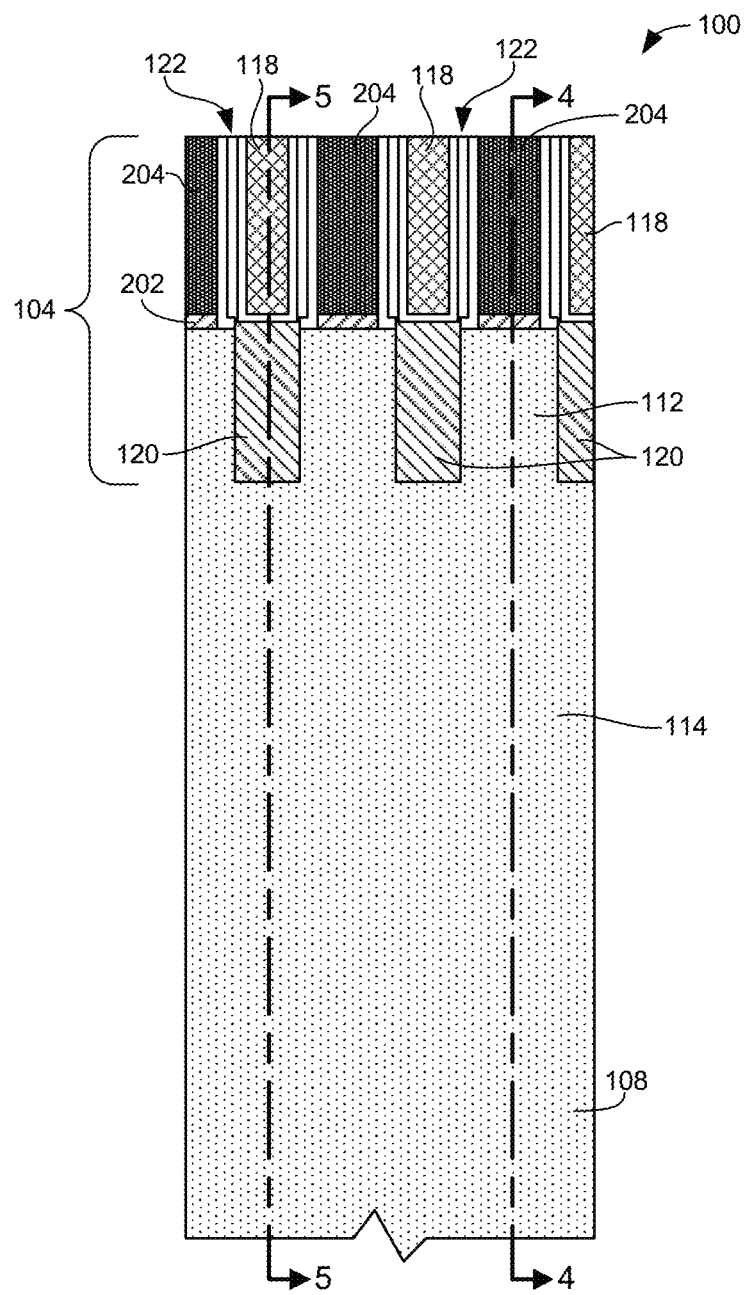
FIGS. 3-5 are cross-sectional views of the example integrated circuit of FIG. 2.
Figure 4:
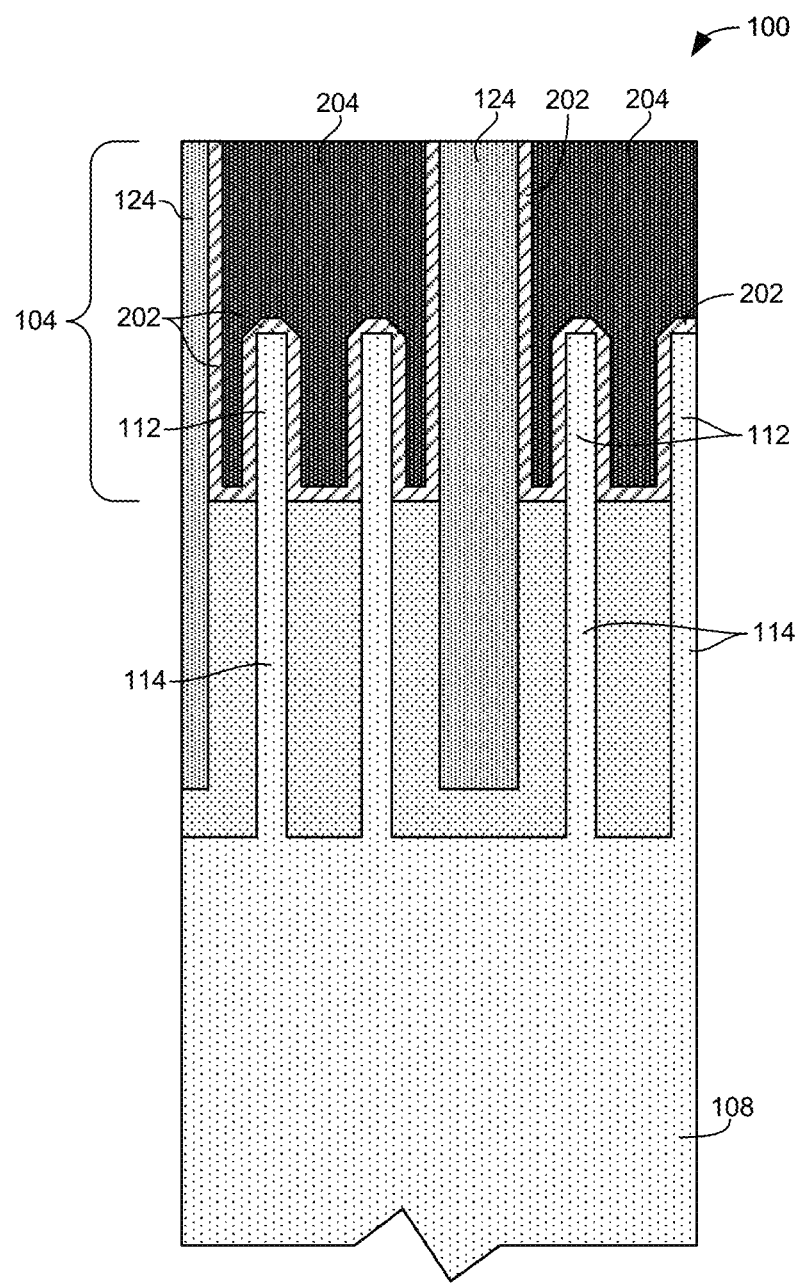
Figure 5:
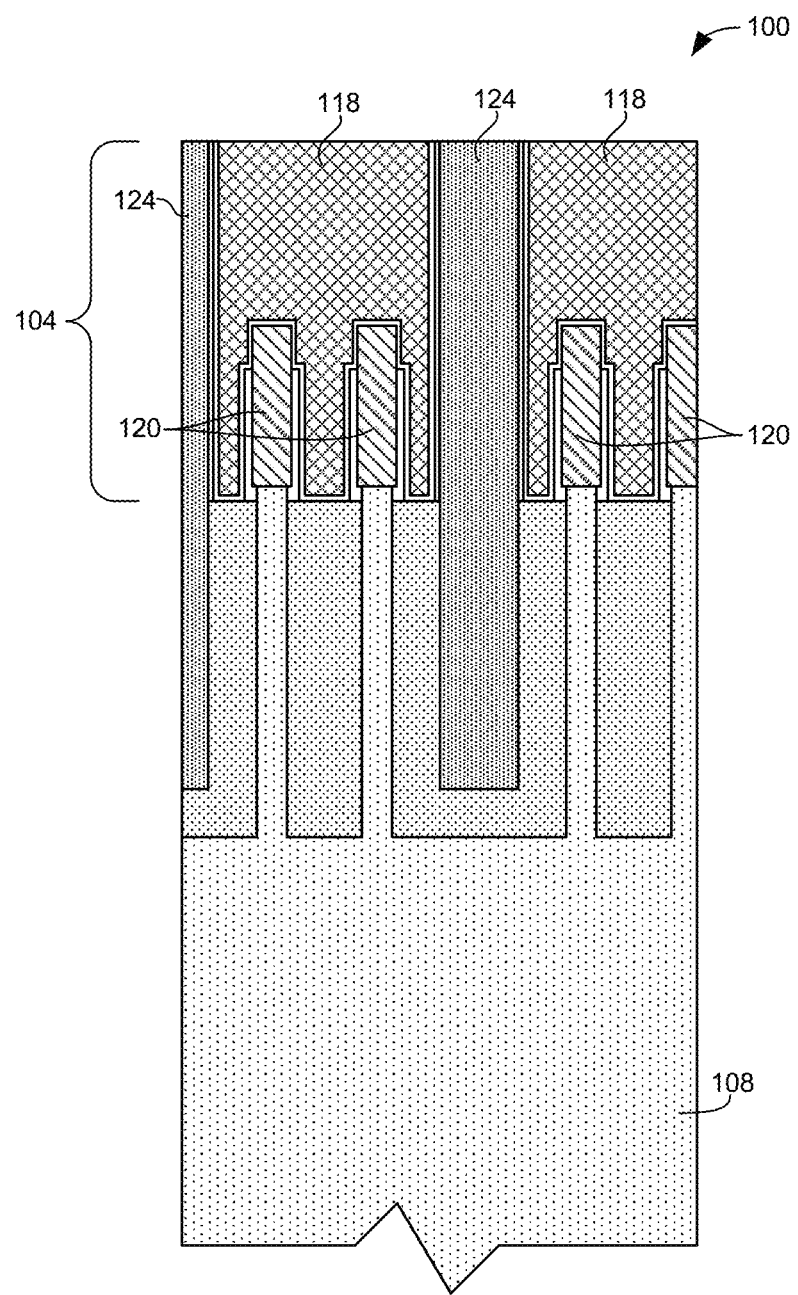

FIGS. 3-5 represent different cross-sectional views of the example integrated circuit 100 at the stage of manufacture represented in FIG. 2. Specifically, FIG. 3 represents a cross-sectional view of the integrated circuit 100 shown in FIG. 2 corresponding to the right face 206 of the integrated circuit 100. The cross-sectional view of FIG. 3 corresponds to cutting along one of the fins 114. FIG. 4 represents a cross-sectional view of the integrated circuit 100 of FIG. 3 taken along the line 4-4. The cross-sectional view of FIG. 4 corresponds to cutting perpendicular to the fins 114 along one portion of the sacrificial gate conductor 204. The cross-sectional view of FIG. 4 also corresponds to the left face 208 of the integrated circuit 100 shown in FIG. 2. FIG. 5 represents a cross-sectional view of the integrated circuit 100 of FIG. 3 taken along the line 5-5. The cross-sectional view of FIG. 5 corresponds to cutting perpendicular to the fins 114 along one of the source and/or drain contacts 118 and the associated doped regions 120 in the fins 114.

The fabrication of the integrated circuit 100 up to the point represented in FIGS. 2-5 follows standard front-end-of-line processing. Thus, as shown in the illustrated examples, the lower transistor level 104 includes the top portion 112 of the lower fins 114 that extend upward from the semiconductor substrate 108. In this example, pairs of the fins 114 are separated by the isolation walls 124. Along the surfaces of the top portions 112 of the fins 114 and the isolation walls 124, the sacrificial gate dielectric 202 is deposited. Further, the sacrificial gate conductor 204 is deposited on the sacrificial gate dielectric 202 between the separate source and/or drain contacts 118. In the illustrated example, the spacers 122 separate the sacrificial gate conductor 204 from the source and/or drain contacts 118.

Figure 6:
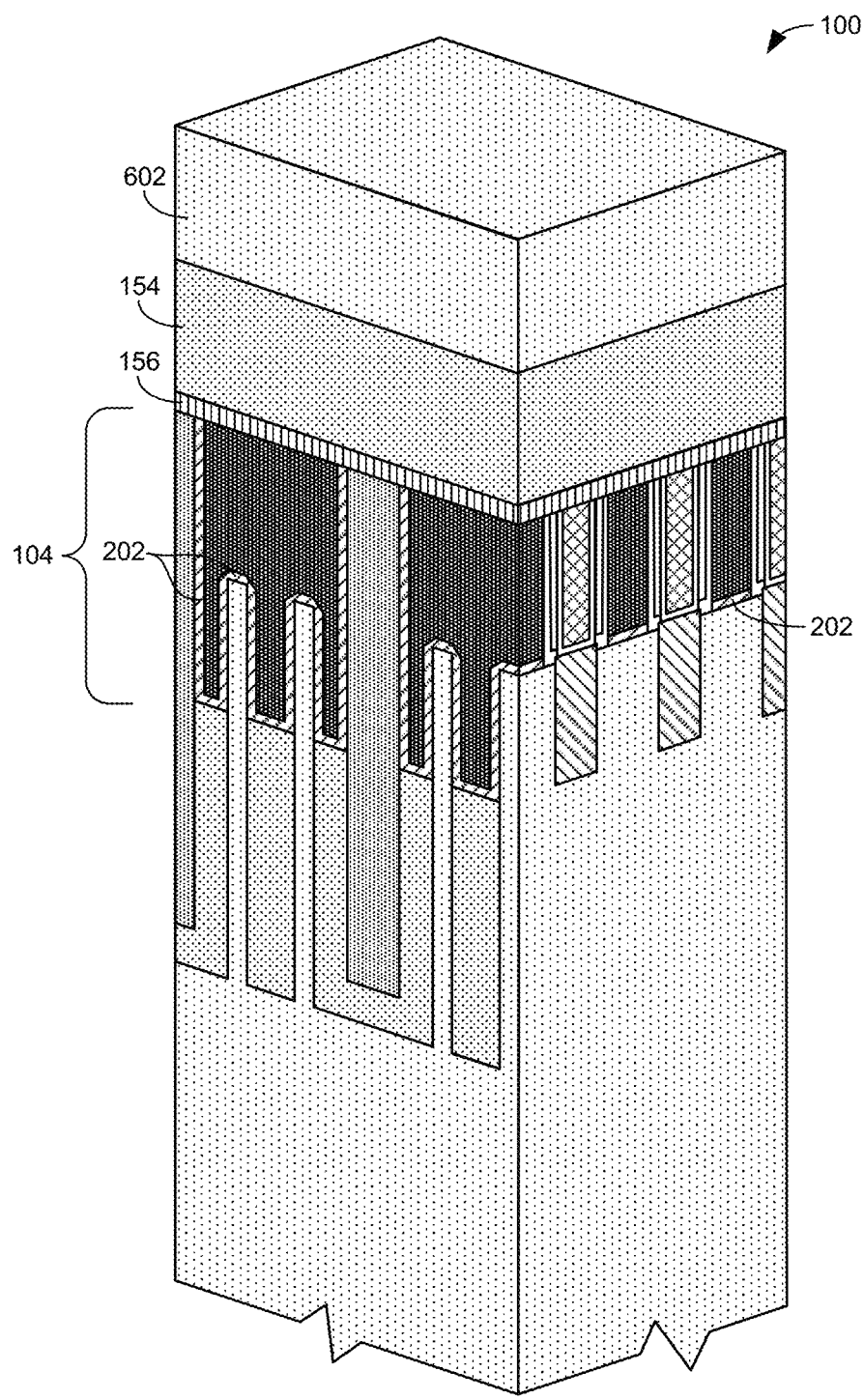
FIGS. 6 and 7 illustrate stages in an example method to add an upper transistor level to the lower transistor level of FIGS. 2-5.

FIG. 6 represents the integrated circuit 100 after the initial processes involved to attach the upper transistor level 102 shown in FIG. 1 onto the lower transistor level 104. In the illustrated example, the etch stop layer 156 is deposited onto the top surface of the lower transistor level 104. Thus, the etch stop layer 156 is deposited above the sacrificial gate dielectric 202 and the sacrificial gate conductor 204 as shown in FIGS. 2-5. Separately, the bonding layer 154 may be deposited onto a surface of a block of semiconductor material 602. The block of semiconductor material 602 is used as the basis to form the upper fins 138 in the upper transistor level 102 of the integrated circuit 100. Thus, the block of semiconductor material 602 may include any suitable semiconductor material for the upper fins 138 (e.g., silicon, germanium, etc.).

In some examples, the block of semiconductor material 602 with the bonding layer 154 disposed thereon is inverted or flipped over and attached to the etch stop layer 156 on the lower transistor level 102 of the integrated circuit 100 as shown in FIG. 6. The bonding layer 154 serves to facilitate the adhesion of the block of semiconductor material 602 to the etch stop layer 156 (and the lower transistor level 104). In some examples, the bonded materials undergo an annealing process to strengthen the adhesion between the bonding layer 154 and the block of semiconductor material 602 and etch stop layer 156 on either side.

Figure 7:
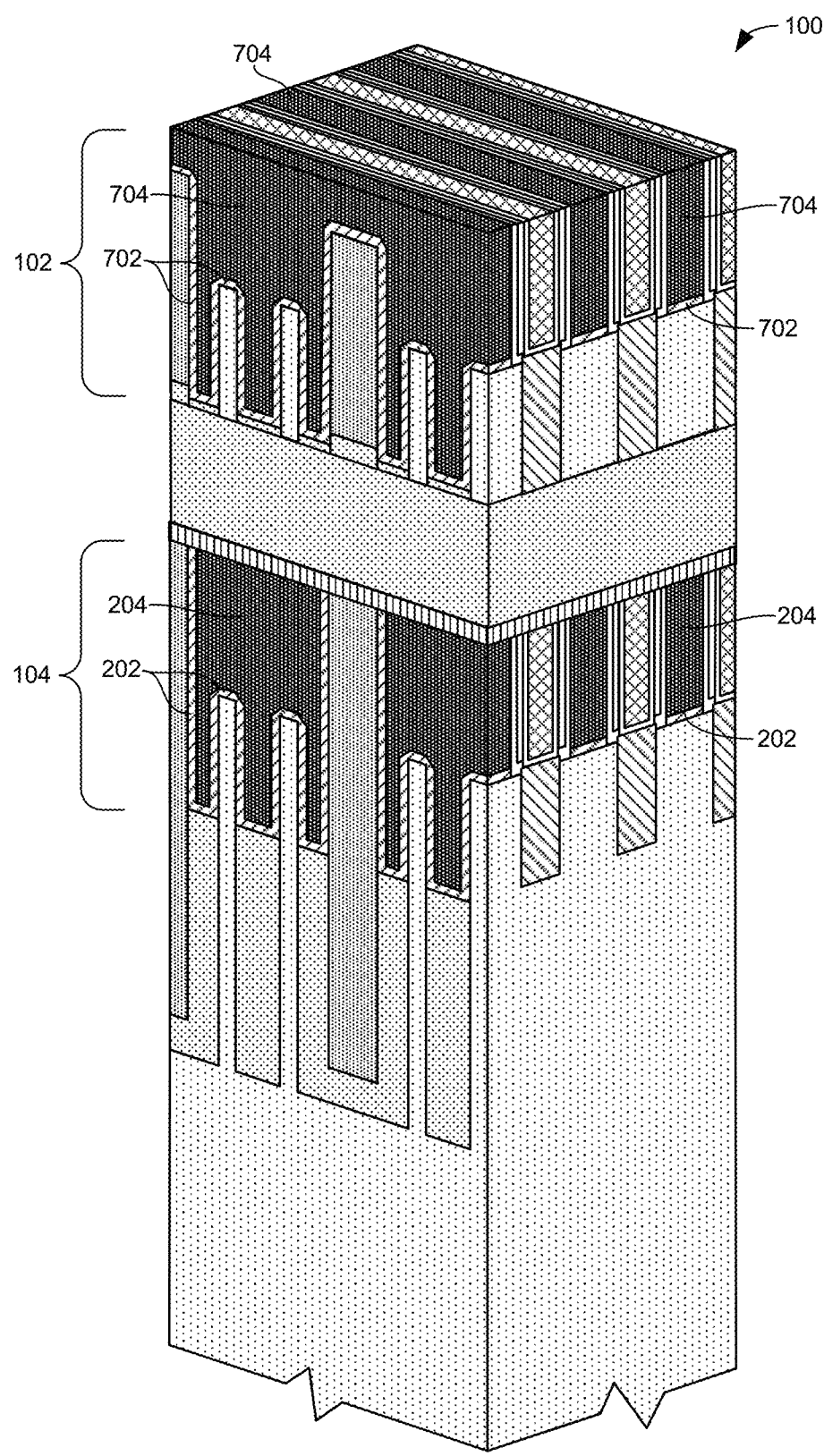

FIG. 7 illustrates the integrated circuit 100 of FIG. 1 after completion of the fabrication of the upper transistor level 102 stacked above the lower transistor level 104. That is, the block of semiconductor material 602 of FIG. 6, may be etched to form the fins 138 and further processing may follow to form the other structures as shown in FIG. 7. The upper transistor level 102 at the stage of fabrication represented in FIG. 7 is structured substantially the same as the upper transistor level 102 when the integrated circuit 100 is completely manufactured as represented in FIG. 1. However, the upper transistor level 102 in FIG. 7 is different than in FIG. 1 in that, at the point in time represented in FIG. 7, the upper transistor level 102 includes a sacrificial gate dielectric 702 with a sacrificial gate conductor 704 deposited thereon. The gate dielectric 702 and the gate conductor 704 in the upper transistor level 102 are sacrificial because they are to be removed and replaced by the upper gate stack 150 and the gate contacts 142 (as shown in FIG. 1) during subsequent processing as described below.

The sacrificial gate dielectric 702 may include any suitable dielectric material. In some examples, it may be the same material as used for the final gate dielectric 130 deposited later in the manufacturing process. In other examples, the material used for the sacrificial gate dielectric 702 may be different than what is used for the final gate dielectric 130 and selected to facilitate its subsequent removal. In some examples, the sacrificial gate dielectric 702 in the upper transistor level 102 includes the same material used for the sacrificial gate dielectric 202 in the lower transistor level 104. In other examples, the sacrificial gate dielectrics 202, 702 in the upper and lower transistor levels 102, 104 are different.

The sacrificial gate conductor 704 may include any suitable material. In some examples, it may be the same material as used for the final gate contacts 116 deposited later in the manufacturing process. In other examples, the sacrificial gate conductor 704 may be different than the final gate contacts 116 and selected to facilitate its subsequent removal. In some examples, the sacrificial gate dielectric 702 in the upper transistor level 102 includes the same material used for the sacrificial gate dielectric 202 in the lower transistor level 104. In some examples, the sacrificial gate conductor 704 in the upper transistor level 102 includes the same material used for the sacrificial gate conductor 204 in the lower transistor level 104. In other examples, the sacrificial gate conductors 204, 704 in the upper and lower transistor levels 102, 104 are different.

The fabrication of the upper transistor level 102 in the integrated circuit 100 up to the point represented in FIG. 7 largely follows standard front-end-of-line processing with a possible exception that some fabrication recipes will be chosen so as to involve lower-temperature processes than would typically be used in order to reduce (e.g., minimize) diffusion of dopants and reduce (e.g., prevent) degradation of contacts formed upon the already formed in the lower transistor level 104. As mentioned above, some of these processes may impact the materials in the lower transistor level 104. Specifically, the fabrication processes for the upper transistor level 102 may cause the sacrificial gate dielectric 202 in the lower transistor level 104 to grow and/or experience a work function shift. However, in this example, dielectric growth and/or a work function shift are not concerns because the gate dielectric 202 in the lower transistor level 104 is sacrificial and will be removed during subsequent processing.

At the stage of manufacture represented in FIG. 7, all fabrication processes to form the structures for the transistors 110 in both the upper and lower transistor levels 102, 104 are complete, except for the final gate stacks 128, 150 and associated gate contacts 116, 142 as shown and described above in connection with FIG. 1. The final gate stacks 128, 150 and associated gate contacts 116, 142 are formed by removing and replacing the sacrificial gate dielectrics 202, 702 and the sacrificial gate conductors 204, 704. Various stages to achieve this are represented in the illustrated examples of FIGS. 8-19. For the sake of clarity, the bulk region 106 of the semiconductor substrate 108 has been removed in these figures to provide enlarged views of the upper and lower transistor levels 102, 104 in FIGS. 8-19. Further, the surface shading provided in FIGS. 1-7 is omitted in the illustrated examples of FIGS. 8-19 to avoid confusion with the layers that are removed and added during the different stages of manufacture represented.

Figure 8:
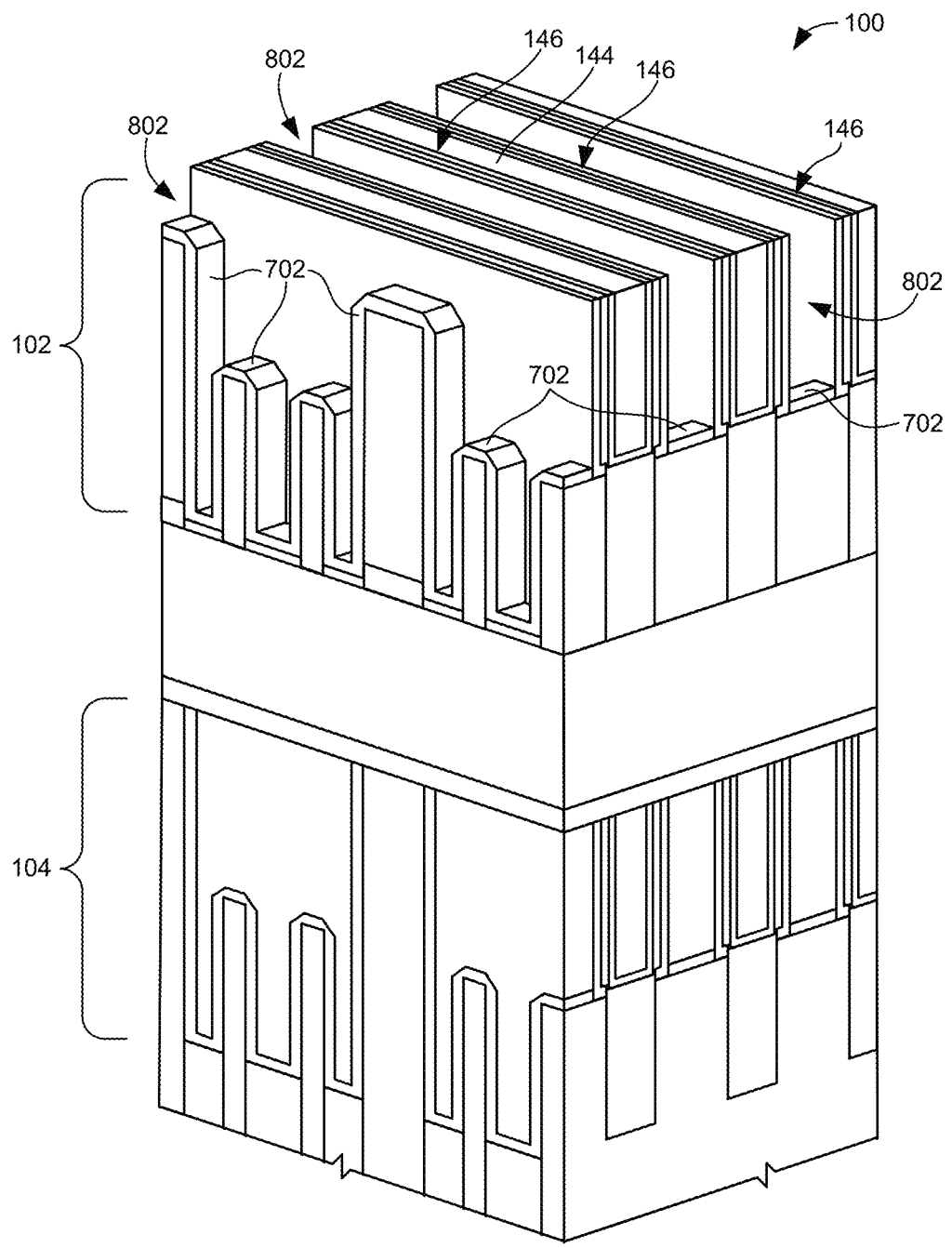

FIG. 8 represents the integrated circuit 100 of FIG. 7 after removal of the sacrificial gate conductor 704 in the upper transistor level 102 shown in FIG. 7. In some example, the sacrificial gate conductor 704 is removed via a wet etching process. As shown, in the illustrated example, the removal of the sacrificial gate conductor 704 creates gaps 802 that expose the walls of the spacers 146 positioned on either side of the source and drain contacts 144. Additionally, removal of the sacrificial gate conductor 704 exposes the sacrificial gate dielectric 702 within the gaps 802.

Figure 9:
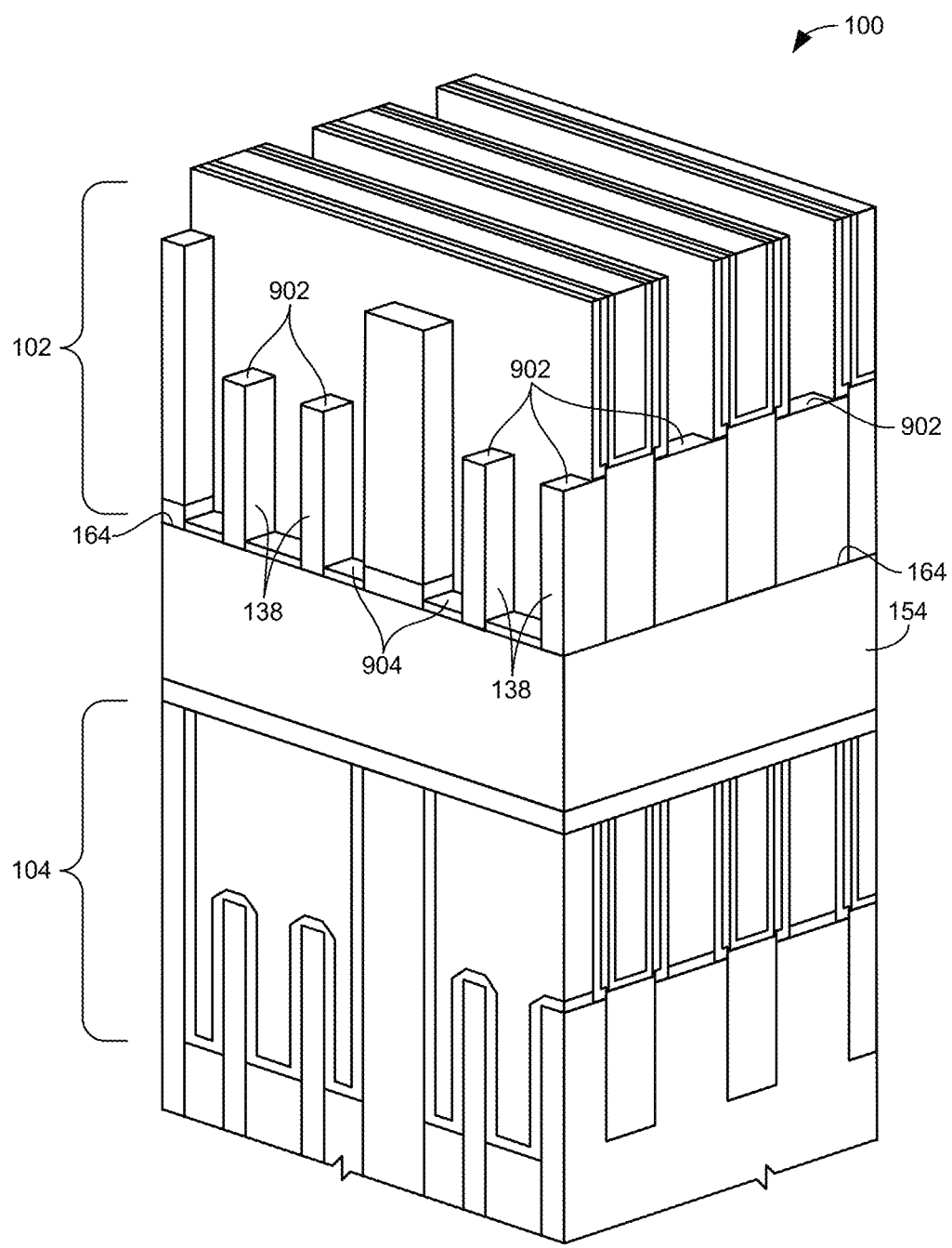

FIG. 9 represents the integrated circuit 100 of FIG. 8 after removal of the sacrificial gate dielectric 702 in the upper transistor level 102 shown in FIG. 8. In some example, the sacrificial gate dielectric 702 is removed via another wet etching process. In some examples, the sacrificial gate conductor 704 and the sacrificial gate dielectric 702 are removed during a single etch process. In some examples, the etching process(es) are selective to the materials used for the spacers 146 and the semiconductor material used for the upper fins 138. In some examples, the etching process(es) are also selective to the materials of the isolation walls 140.

As shown, in the illustrated example, the removal of the sacrificial gate conductor 704 exposes a top surface 902 of the upper fins 138 as well as sidewalls of the upper fins 138. Additionally, the removal of the sacrificial gate conductor 704 exposes a layer of isolation material 904 formed on the top surface 164 of the bonding layer 154 during the fabrication of the upper transistor level 102. In some examples, the layer of isolation material 904 is the same material used to form the bonding layer 154.

Figure 10:
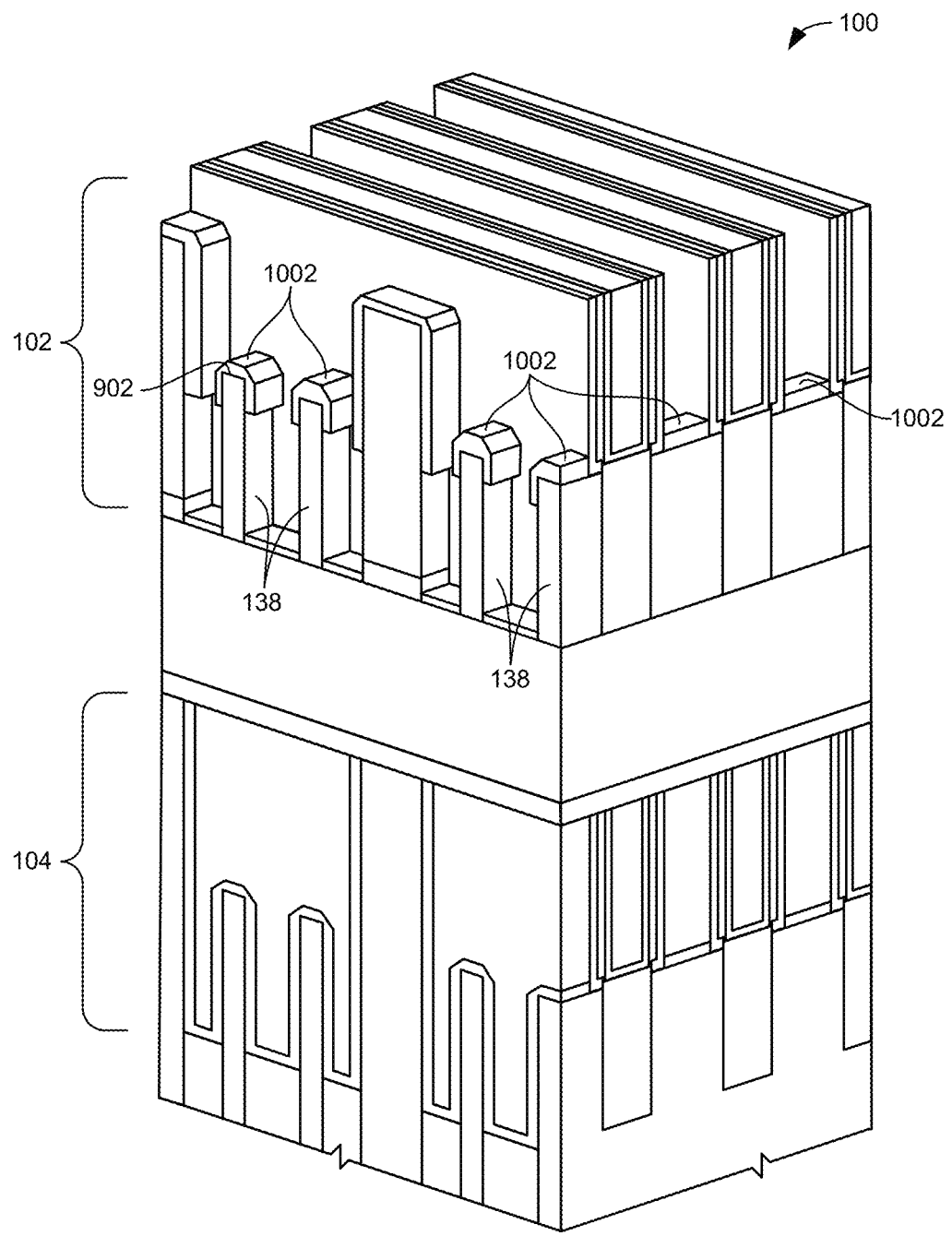

FIG. 10 represents the integrated circuit 100 of FIG. 9 after depositing a protective cover 1002 over the top surfaces 902 of the upper fins 138. The protective cover 1002 serves to protect the upper fins 138 from subsequent etching processes described below in connection with FIG. 11. The protective cover 1002 may include any suitable material such as, for example, doped silicon, silicide, a metal, a nitride hard mask, etc. The particular material used for the protective cover 1002 depends upon the materials to be etched during the subsequent etching processes. That is, different materials for the protective cover 1002 are identified based on their etch selectivity with respect to the materials to be etched. The protective cover 1002 may include any suitable shape and dimensions. Thus, as shown in the illustrated example, the protective cover 1002 extends part way down the sidewalls of the fins 138. In other examples, the protective cover 1002 may be limited to the top surface 902 of the fins 138. In other examples, the protective cover 1002 may extends a greater or lesser extent down the sidewalls of the fins 138 than what is shown in FIG. 10. In some examples, the protective cover 1002 may be omitted (as represented in the remaining illustrations).

Figure 11:
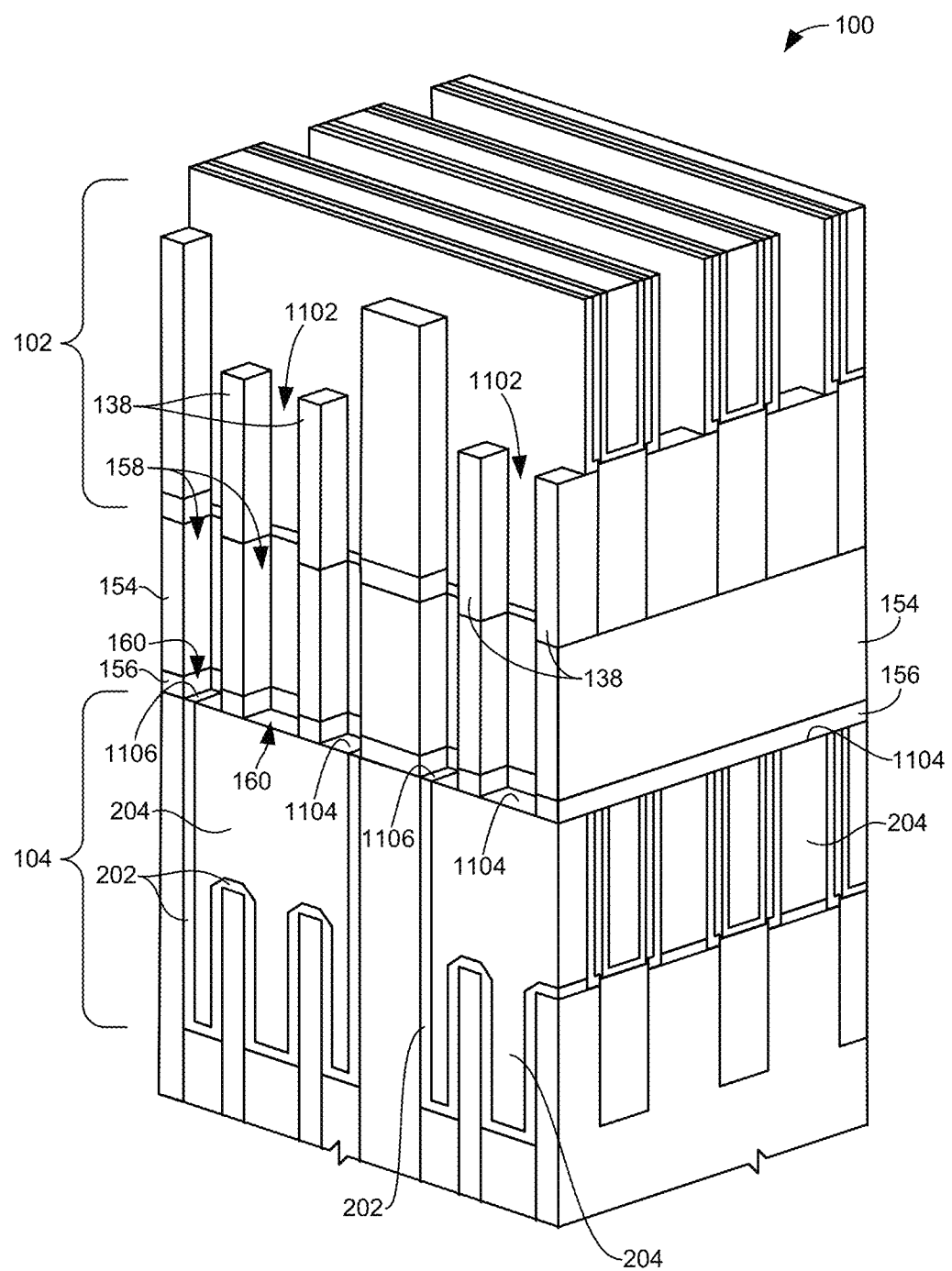

FIG. 11 represents the integrated circuit 100 of FIG. 10 after forming the openings 158, 160 through the bonding layer 154 and the etch stop layer 156. In some examples, the openings 158, 160 are formed through a dry etching process. As shown in the illustrated example, the openings 158, 160 extend vertically in alignment with the space 1102 between adjacent ones of the upper fins 138. The openings 158, 160 in conjunction with the space 1102 between the fins 138 provides a path to access materials of the lower transistor level 104. More particularly, as shown in the illustrated example, the openings 158, 160 expose a top surface 1104 of the sacrificial gate conductor 204 in the lower transistor level 104 and a top surface 1106 of the sacrificial gate dielectric 202.

Figure 12:
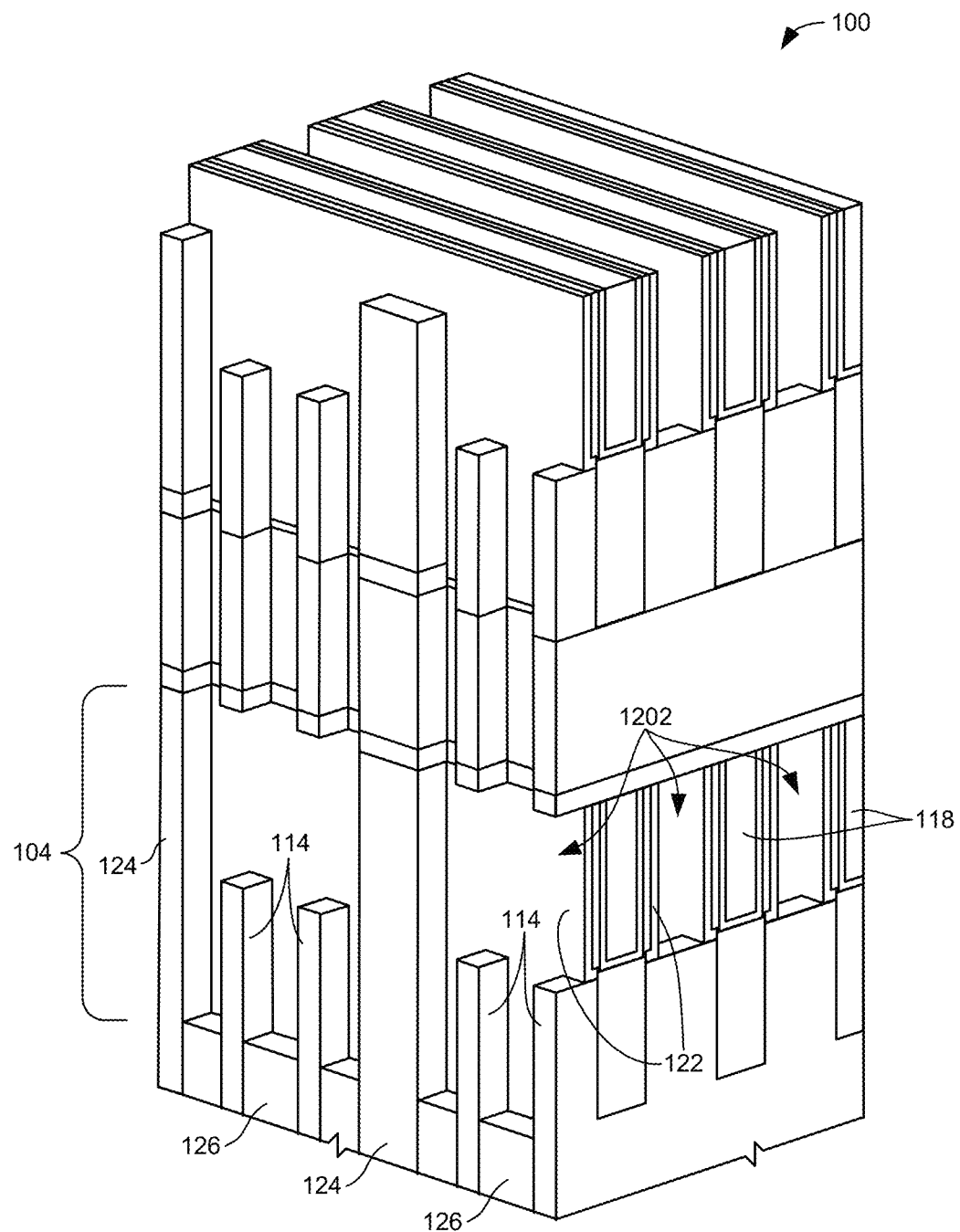

Access to the lower transistor level 104 as shown in FIG. 11, makes it possible to remove the sacrificial gate conductor 204 and the sacrificial gate dielectric 202 in the lower transistor level 104 as represented in FIG. 12. That is, FIG. 12 represents the integrated circuit 100 of FIG. 11 after removal of both the sacrificial gate dielectric 202 and the sacrificial gate conductor 204. As shown, in the illustrated example, the removal of the sacrificial gate conductor 204 and the sacrificial gate dielectric 202 creates gaps 1202 that expose the walls of the spacers 122 positioned on either side of the source and drain contacts 118 in the lower transistor level 104. Additionally, removal of the sacrificial gate conductor 704 exposes a top surface of the STI material 126 between the lower fins 114.

In some example, the sacrificial gate conductor 204 is removed in a first wet etching process followed by the removal of the sacrificial gate dielectric 202 with a second wet etching process. In other examples, the sacrificial gate conductor 204 and the sacrificial gate dielectric 202 are removed during a single etching process. In some examples, the etching process(es) are selective to the materials used for the spacers 122 and the semiconductor material use for the lower fins 114. In some examples, the etching process(es) are also selective to the materials of the isolation walls 124.

Figure 13:
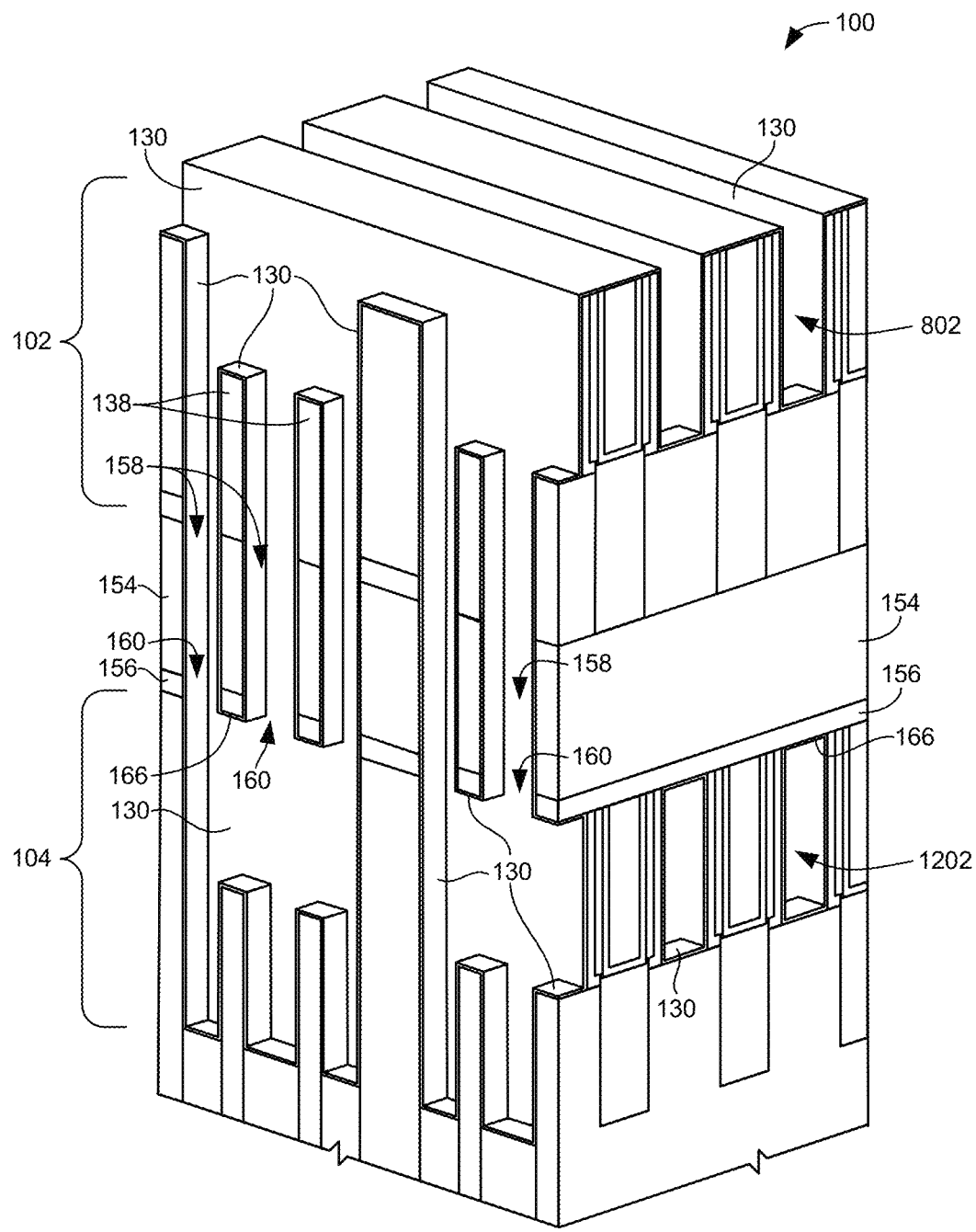

With the sacrificial materials in both the upper and lower transistor levels 102, 104 of the integrated circuit 100, as shown in FIG. 12, the final gate materials may be deposited in their place. FIG. 13 represents the integrated circuit 100 of FIG. 12 after depositing a thin gate dielectric 130 on the exposed surfaces in the gaps 802, 1202 in the upper and lower transistor levels 102, 104 made by removing the sacrificial materials. In this example, the gate dielectric 130 extends continuously through both the upper and lower transistor levels 102, 104. Thus, as shown in the illustrated example, the gate dielectric 130 lines the walls of the openings 158, 160 of the bonding and etch stop layers 154, 156. Furthermore, as shown in the illustrated example, the gate dielectric 130 is deposited on the bottom surface 166 of the etch stop layer 156. In some examples, the gate dielectric 130 is deposited using atomic layer deposition (ALD) or any other suitable deposition technique.

Figure 14:
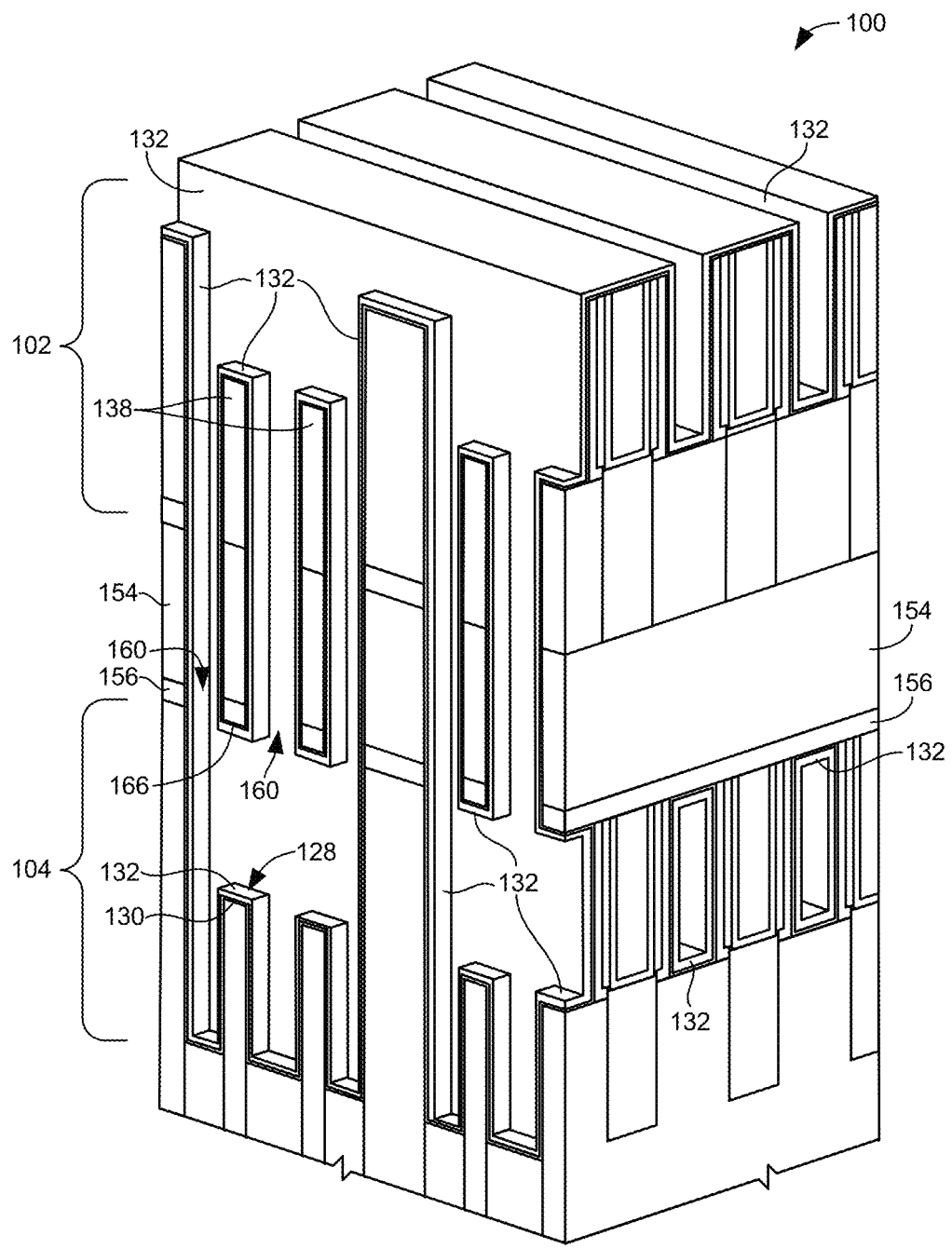

FIG. 14 represents the integrated circuit 100 of FIG. 13 after depositing the additional gate stack materials 132 associated with the lower gate stack 128 on the exposed surfaces of the gate dielectric 130. As shown in the illustrated example, the additional gate stack materials 132 extend continuously through both the upper and lower transistor levels 102, 104. Thus, as with the gate dielectric 130, the additional gate stack materials 132 also line the walls of the openings 158, 160 of the bonding and etch stop layers 154, 156 at the stage of fabrication represented in FIG. 14. Furthermore, as shown in the illustrated example, the additional gate stack materials 132 are deposited on the bottom surface 166 of the etch stop layer 156 (with the gate dielectric 130 therebetween). In some examples, the additional gate stack materials 132 are deposited using atomic layer deposition (ALD) or any other suitable deposition technique. As mentioned above, the additional gate stack materials 132 may include one or more layers. In some examples, each layer is deposited in a separate process.

Figure 15:
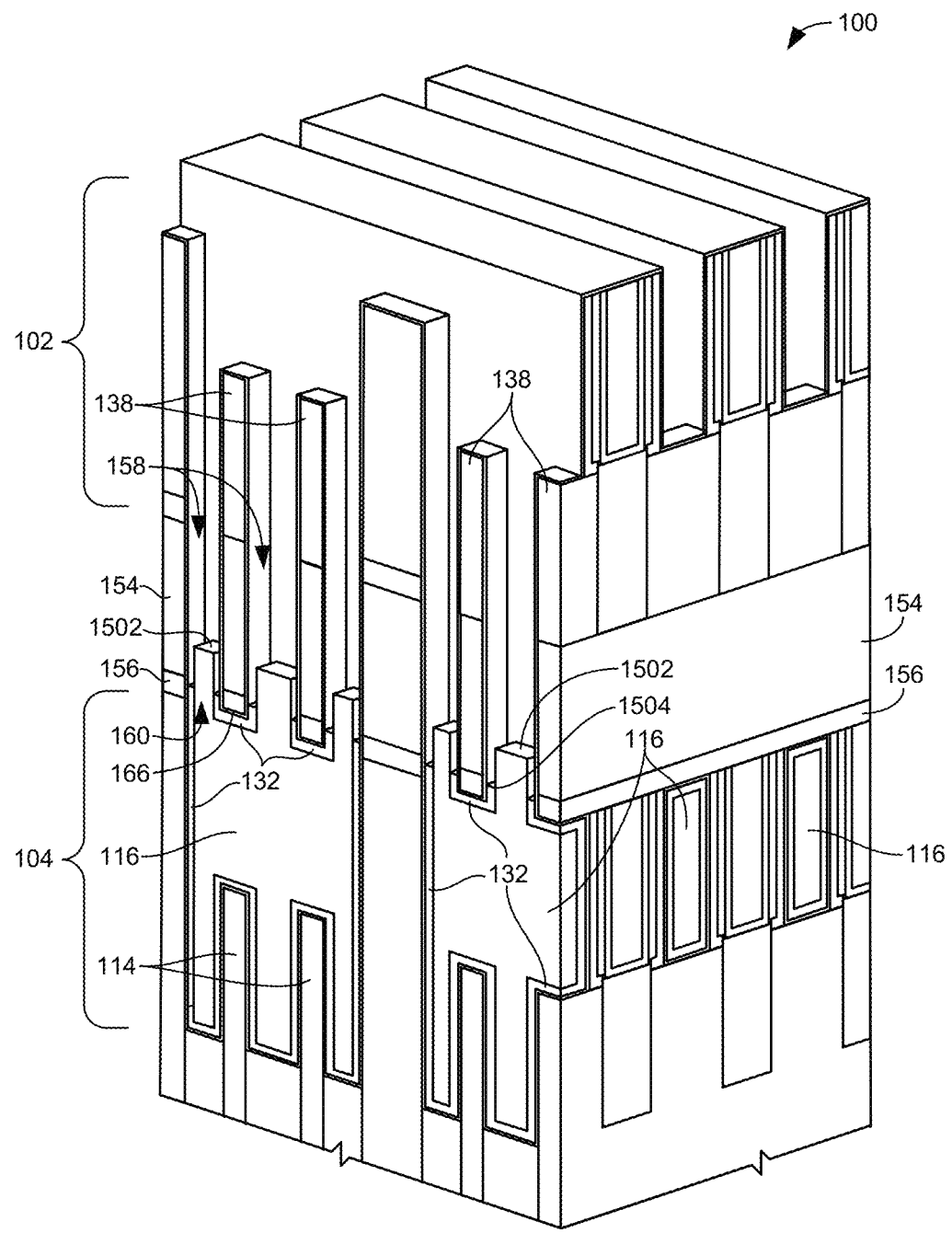

FIG. 15 represents the integrated circuit 100 of FIG. 14 after depositing the lower gate contacts 116 within the lower transistor level 104 and removing the additional gate stack materials 132 from the upper transistor level 102. That is, in some examples, the material of the gate contacts 116 fills the remaining space within the gaps 1202 formed by the removal of the sacrificial gate materials shown in FIG. 12. In some examples, the gate contacts 116 may extend up through the openings 158, 160 of the bonding and etch stop layers 154, 156. Thus, as shown in FIG. 15, a top surface 1502 of the gate contacts 116 is above the etch stop layer 156. For example, the top surface 1502 of the gate contacts 116 may be positioned such that it is within 5-10 nm of the lower surface of upper fins 138 to facilitate the deposition of the material for the upper gate contacts 142 to fill the space within the opening 158 of the bonding layer 154.

As mentioned above, FIG. 15 also represents the removal the additional gate stack materials 132 from the upper transistor level 102. More particularly, as shown in the illustrated example, the additional gate stack material 132 is recessed or etched so that a top surface 1504 of the additional gate stack material 132 is below the top surface 1502 of the gate contacts 116. In some examples, the top surface of the 1504 of the additional gate stack material 132 remains above the bottom surface 166 of the etch stop layer 156. In this example, the top surface 1504 of the additional gate stack material 132 is at a height positioned between the opposing surface of the etch stop layer 156.

Figure 16:
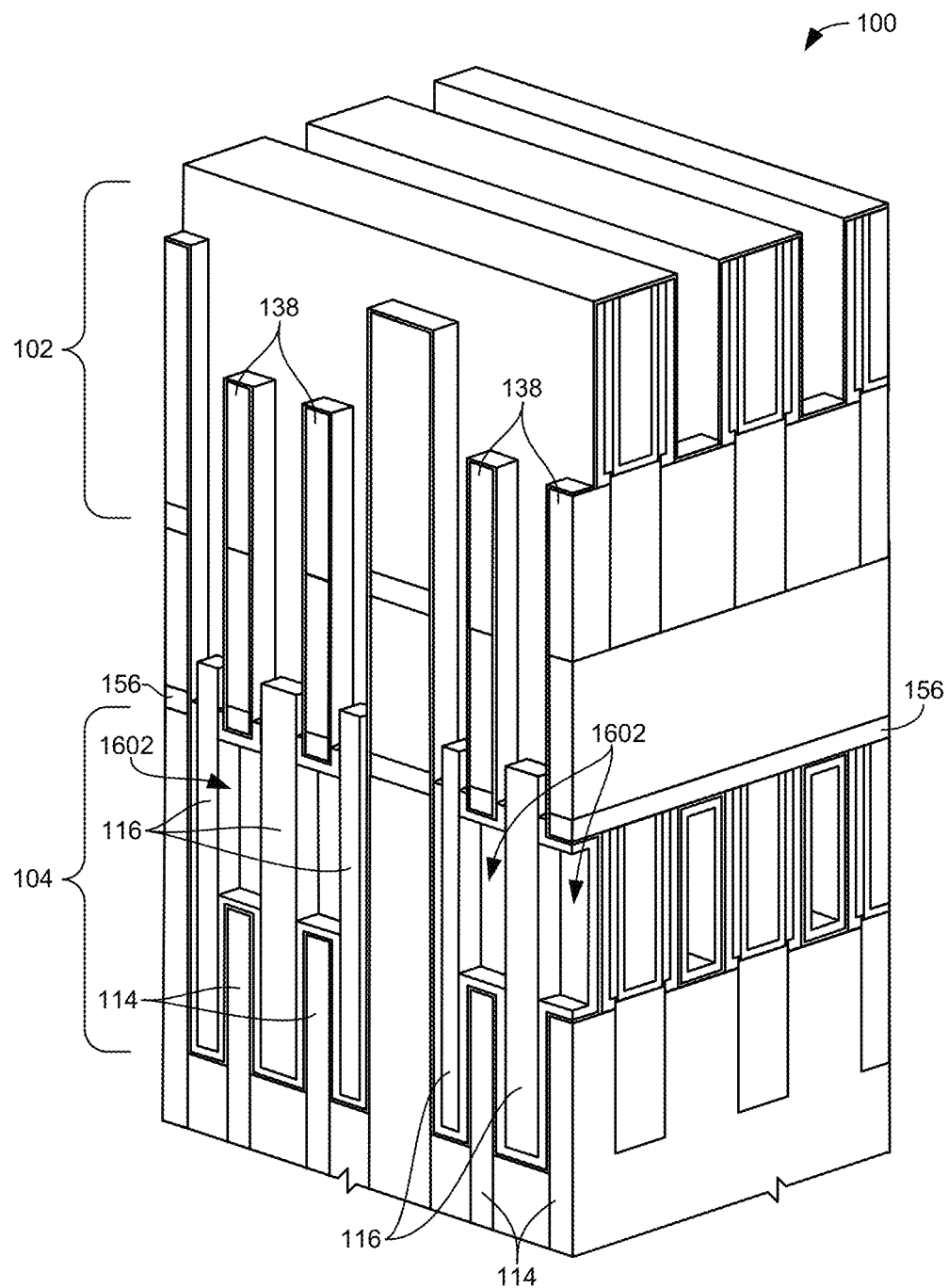

In some examples, the gate contacts 116 may extend continuously around the lower fins 114 from one sidewall of the fins 114 to the other sidewall as shown in FIG. 15. That is, in some examples, the area vertically aligned with and between the upper and lower fins 114, 138 is solid and filled with the gate contacts 116 material. In other examples, as shown in FIG. 16, the gate contacts 116 adjacent one sidewall of a particular fin 114 may be separated from the gate contact 116 adjacent the opposite sidewall of the same fin 114. That is, in some examples, there may be voids 1602 in the area vertically aligned with the upper and lower fins 114, 138 and between the lower fins 114 and the etch stop layer 156 with little or no gate contact material. The voids 1602 may result from the directional nature of the processes used to deposit the gate contacts 116, which are incapable of depositing material underneath the upper fins 138.

Figure 17:
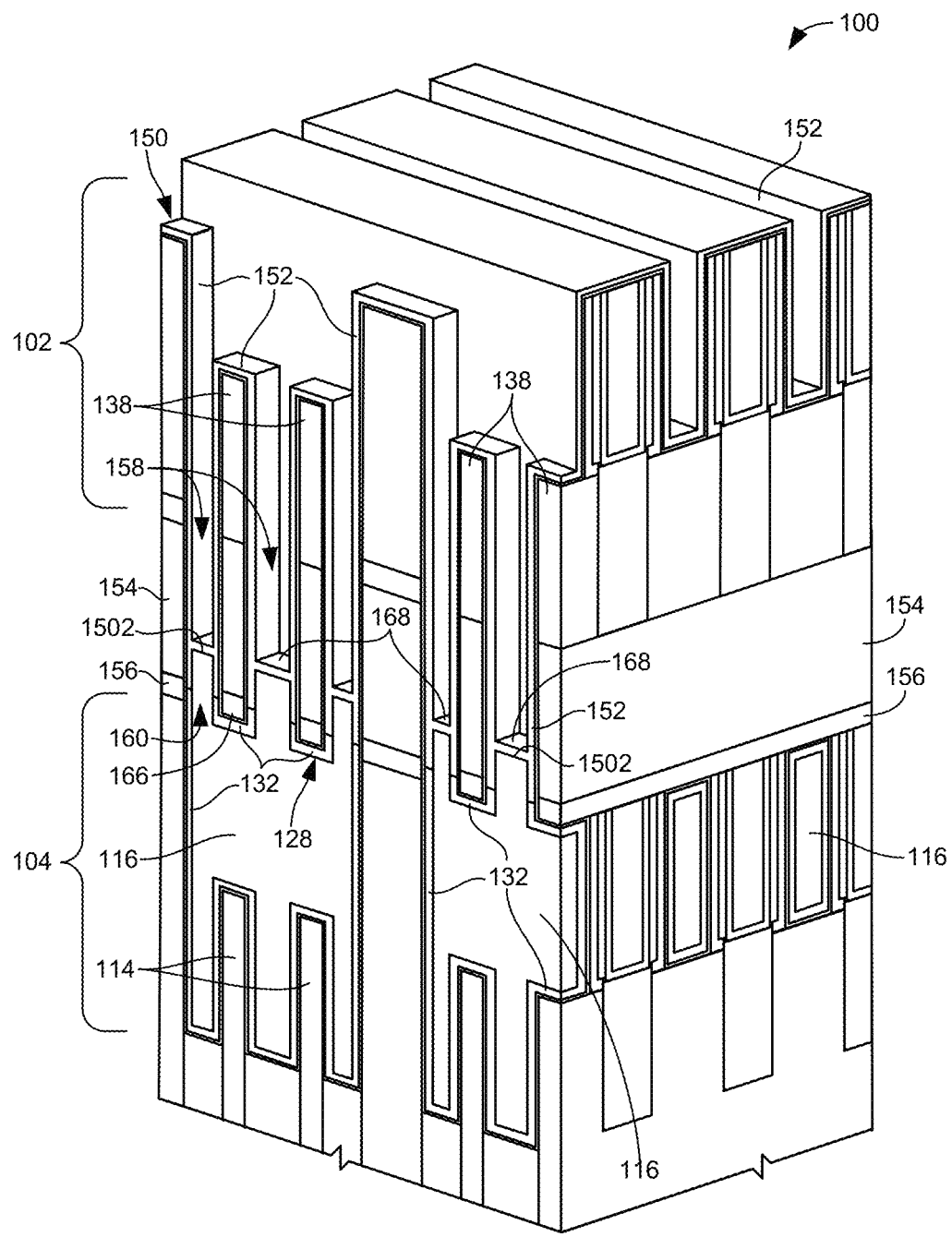

FIG. 17 represents the integrated circuit 100 of FIG. 13 after depositing the additional gate stack materials 152 associated with the upper gate stack 150 on the exposed surfaces of the gate dielectric 130 in the upper transistor level 102. As with the additional gate stack materials 132 of the lower gate stack 128, the additional gate stack materials 152 of the upper gate stack 150 include a gate conductor metal and may also include one or more other metals and/or other materials. As shown in the illustrated example, the additional gate stack materials 152 extend down along the walls of the openings 158, 160 of the bonding and etch stop layers 154, 156 to the additional gate stack materials 132 associated with the lower gate stack 128. Additionally, as shown in FIG. 17, the additional gate stack materials 152 extend over the top surface 1502 of the lower gate contacts 116 to form the bridges 168 within the openings 160 of the bonding layer 154. In some examples, the additional gate stack materials 152 are deposited using atomic layer deposition (ALD) or any other suitable deposition technique. As mentioned above, the additional gate stack materials 152 may include one or more layers. In some examples, each layer is deposited in a separate process.

Figure 18:
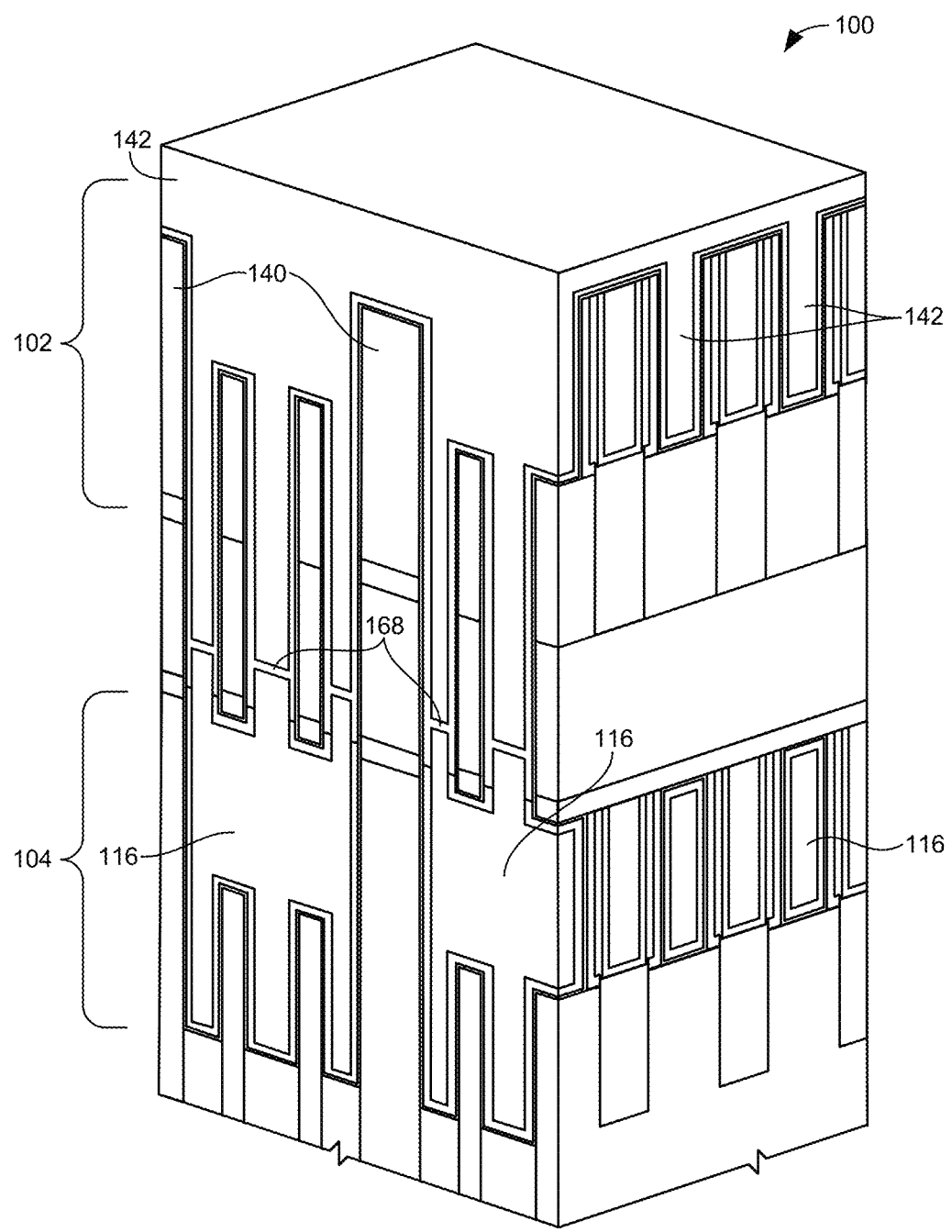

FIG. 18 represents the integrated circuit 100 of FIG. 17 after depositing the material for the upper gate contacts 142 within the upper transistor level 102. That is, in some examples, the gate contact material fills the remaining space within the gaps 802 formed by the removal of the sacrificial gate materials shown in FIG. 8. In some examples, the material for the gate contacts 142 extends down through the openings 158, 160 of the bonding and etch stop layers 154, 156 to the bridges 168 adjacent the lower gate contacts 116. The bridges 168 between the portions of the upper and lower gate contacts 116, 142 provide electrical connectivity between the gate contacts 116, 142. FIG. 18 represents the integrated circuit 100 as shown in FIG. 1 with a difference being that the excess materials on the top surface of the integrated circuit 100 shown in FIG. 18 have not yet been removed. Once these materials are removed (e.g., via polishing), the integrated circuit 100 shown in FIG. 18 would be the same as the integrated circuit 100 shown in FIG. 1. As mentioned above, in some examples, the top portion of structure of the integrated circuit 100 shown in FIG. 18 is polished down below that which is represented in FIG. 1 to a height that is below the top of isolation walls 140 to electrically isolate the gate contacts 142 associated with separate pairs of transistors in the illustrated example.

In some example, the electrical connection between the upper and lower gate contacts 116, 142 may be improved by removing the bridges 168 positioned therebetween to reduce resistance between the gate contacts 116, 142. That is, before the upper gate contacts 142 are deposited, the exposed additional gate stack materials 152 may undergo an etching process to remove the bridge 168 as shown in FIG. 19. As a result, the upper and lower gate contacts 116, 142 may be in direct contact at an interface 1902. In some examples, where the same material is used for the upper and lower gate contacts 116, 142, the separate gate contacts 116, 142 may be integrally formed without the interface 1902. This is possible when the additional gate stack materials 132, 152 are also formed of the same materials. In such examples, the additional gate stack materials are deposited continuously through both the upper and lower transistor levels 102, 104 (similar to what is shown in FIG. 14). Thereafter, the rest of the gaps remaining within the additional gate stack materials are filled with the single gate contact material in both the upper and lower transistor levels 102, 104.

In some examples, as shown in FIG. 19, the etching process to remove the bridges 168 may also remove the additional gate stack materials 152 adjacent the top surface 902 of the upper fins 138 (as well as the isolation walls 140). Removing the additional gate stack 152 from the top surface 902 of the upper fins 138 may be suitable in situations where the upper fins 138 include a non-conductive cap 2002 above a semiconductor region 2004, as represented in FIG. 20, because there would be no electrical penalty from removing the additional gate stack materials 152. In some examples, the non-conductive cap 2002 may result form artifacts of fabrication processes used when initially forming the fins 138.

Figure 21:
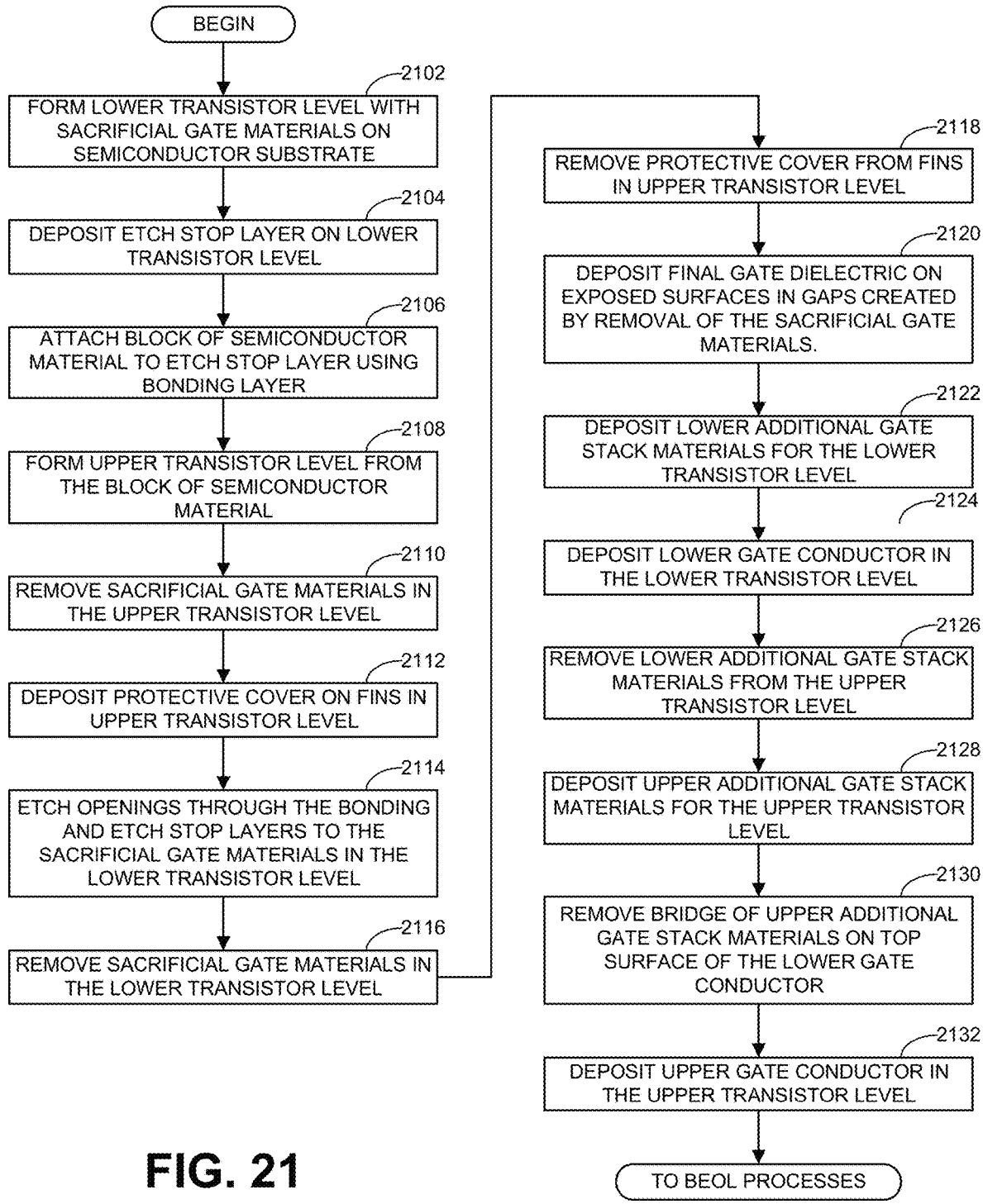
FIG. 21 is a flowchart representative of an example method of manufacturing the example integrated circuit of FIG. 1.

FIG. 21 is a flowchart representative of an example method of manufacturing the example integrated circuit of FIG. 1. The example process begins at block 2102 where the lower transistor level 104 is formed with sacrificial gate materials on the semiconductor substrate 108. The sacrificial gate materials include the lower sacrificial gate dielectric 202 and the lower sacrificial gate conductor 204. Any suitable front-end-of-line processes may be used during the formation of the lower transistor level 104. At block 2104, the etch stop layer 156 is deposited on lower transistor level 104. At block 2106, the block of semiconductor material 602 is attached to the etch stop layer 156 using a bonding layer 154. In some examples, the bonding layer 154 is formed on an upper surface of the block of semiconductor material 606 and then the stack of materials is inverted for mounting to the etch stop layer 156.

At block 2108, the upper transistor level 102 is formed from the block of semiconductor material 606. In this example, the upper transistor layer is formed using sacrificial gate materials including the upper sacrificial gate dielectric 702 and the upper sacrificial gate conductor 704. In some examples, the upper transistor level 102 is formed with semiconductor fins 138 in vertical alignment with lower semiconductor fins 114 in the lower transistor level 104. Vertically aligning the fins results in the vertical alignment of the spaces between the fins to define a straight path through which final gate materials may be deposited in the lower transistor level 104 during a subsequent stage in the manufacturing process. Any suitable front-end-of-line processes may be used during the formation of the upper transistor level 102. That is, there are no thermal limitations on the processes available to form the upper transistor level 102 because the processes cannot affect the final gate materials inasmuch as they have not yet been deposited. While higher temperature processes (e.g., processes associated with temperatures above 400° Celsius) may cause dielectric growth and/or a work function shift in the gate materials in the lower transistor level 104, these effects are of little concern because the affected materials will be removed and replaced during subsequent processing.

At block 2110, the sacrificial gate materials in the upper transistor level 102 are removed. In some examples, this is accomplished through a first wet etching procedure to remove the upper sacrificial gate conductor 704 followed by a second wet etching procedure to remove the upper sacrificial gate dielectric 702. At block 2112, a protective cover 1002 is deposited on the upper fins 138 in the upper transistor level 102. The protected cover 1002 serves to protect the top surfaces of the upper fins 138. Block 2112 is optional. Thus, in some examples, block 2112 is omitted.

At block 2114, openings 158, 160 are etched through the bonding and etch stop layers 154, 156 to the sacrificial gate materials in the lower transistor level 104. That is, in some examples, the openings 158, 160 are in vertical alignment with the spaces between the upper and lower fins 114, 138. In this manner, the openings expose and provide access to the gate materials in the lower transistor level 104. In some examples, the bonding and etch stop layers are etched using one or more dry etching procedures.

At block 2116, the sacrificial gate materials in the lower transistor level 104 are removed. In some examples, this is accomplished through a first wet etching procedure to remove the lower sacrificial gate conductor 204 followed by a second wet etching procedure to remove the lower sacrificial gate dielectric 202. At block 2118, the protective cover 1002 (formed at block 2112) is removed from the upper fins 138 in the upper transistor level 102.

At block 2120, the final gate dielectric 130 is deposited on exposed surfaces in gaps 802, 1202 created by removal of the sacrificial gate materials (at blocks 2110 and 2116). In some examples, the final gate dielectric 130 is deposited using an ALD process. At block 2122, the lower additional gate stack materials 132 are deposited for the lower transistor level 104. In some examples, the lower additional gate stack materials 132 may include multiple different layers of materials deposited during multiple ALD processes. At block 2124, the lower gate contacts 116 are deposited in the lower transistor level 104. In some examples, the lower gate contacts 116 are deposited so as to extend into the openings 158, 160 of the bonding and etch stop layers 154, 156.

At block 2126, the lower additional gate stack materials 132 (deposited at block 2122) are removed from the upper transistor level 102. That is, in some examples, the additional gate stack materials 132 are etched away down to a location within the openings 158, 160 of the bonding and etch stop layers 154, 156.

At block 2128, the upper additional gate stack materials 152 are deposited for the upper transistor level 102. In some examples, the upper additional gate stack materials 152 may include multiple different layers of materials deposited during multiple ALD processes. In some examples, where the same additional gate stack materials are used in both the upper and lower transistor levels 102, 104, blocks 2126 and 2128 may be omitted.

At block 2130, the bridge 168 of the upper additional gate stack materials 152 on the top surface 1502 of the lower gate contacts 116 is removed. In some example, the upper additional gate stack materials 152 on the top surface 902 of the upper fins are also removed during this etching process. In some examples, block 2130 is omitted. At block 2132, the upper gate contacts 142 are deposited in the upper transistor level 104. In some examples, the upper gate contacts 142 extend down below the upper fins 138 into the openings 158, 160 of the bonding and etch stop layers 154, 156 to interface with the lower gate contacts 116. The interface between the upper and lower gate contacts 116, 142 provide electrical connectivity between the conductors. In some examples, the upper and lower gate contacts 116, 142 interface via the bridge 168 (when block 2130 is omitted). If the bridge 168 is removed (at block 2130), the upper and lower gate contacts 116, 142 may be in direct contact. Block 2132 represents the end of the example process of FIG. 21. Thereafter, the integrated circuit 100 may proceed to back-end-of-line (BEOL) processes to complete the fabrication of the integrated circuit.

Although the example method of FIG. 21 is described with reference to the flowchart shown in FIG. 21, many other methods of manufacturing the example integrated circuit 100 of FIG. 1 may alternatively be used. For example, the order of execution of the blocks in FIG. 21 may be changed, and/or some of the blocks described may be changed, eliminated, or combined. Similarly, additional operations may be included in the manufacturing process before, in between, or after the blocks shown in FIG. 21.

The example disclosed herein may be included in any suitable electronic component. FIGS. 22-26 illustrate various examples of apparatus that may include the integrated circuit 100 with stacked transistors disclosed herein.

Figure 22:
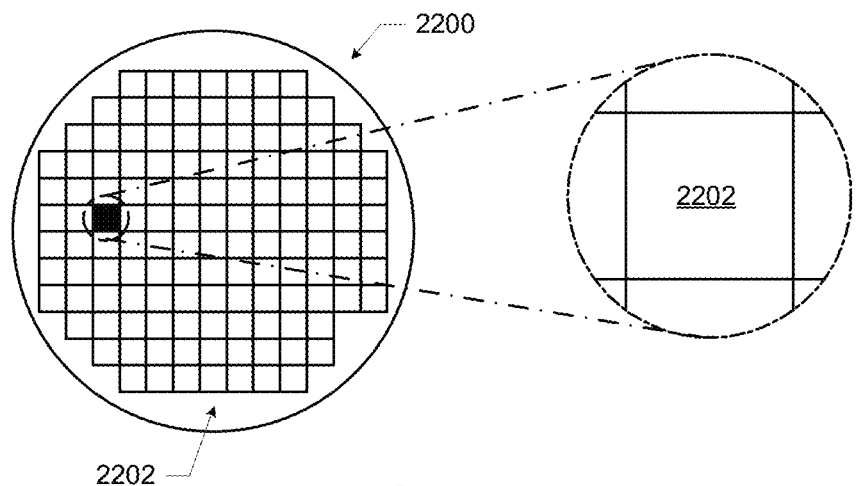
FIG. 22 is a top view of a wafer and dies that may include an integrated circuit with stacked transistors, in accordance with any of the examples disclosed herein.

FIG. 22 is a top view of a wafer 2200 and dies 2202 that may include one or more stacked transistors, or may be included in an IC package whose substrate includes one or more stacked transistors (e.g., as discussed below with reference to FIG. 24) in accordance with any of the examples disclosed herein. The wafer 2200 may be composed of semiconductor material and may include one or more dies 2202 having IC structures formed on a surface of the wafer 2200. Each of the dies 2202 may be a repeating unit of a semiconductor product that includes any suitable IC. After the fabrication of the semiconductor product is complete, the wafer 2200 may undergo a singulation process in which the dies 2202 are separated from one another to provide discrete "chips" of the semiconductor product. The die 2202 may include one or more stacked transistors (e.g., as discussed below with reference to FIG. 23), one or more transistors (e.g., some of the transistors 2340 of FIG. 23, discussed below) and/or supporting circuitry to route electrical signals to the transistors, as well as any other IC components. In some examples, the wafer 2200 or the die 2202 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 2202. For example, a memory array formed by multiple memory devices may be formed on a same die 2202 as a processing device (e.g., the processing device 2602 of FIG. 26) or other logic that is configured to store information in the memory devices or execute instructions stored in the memory array.

Figure 23:
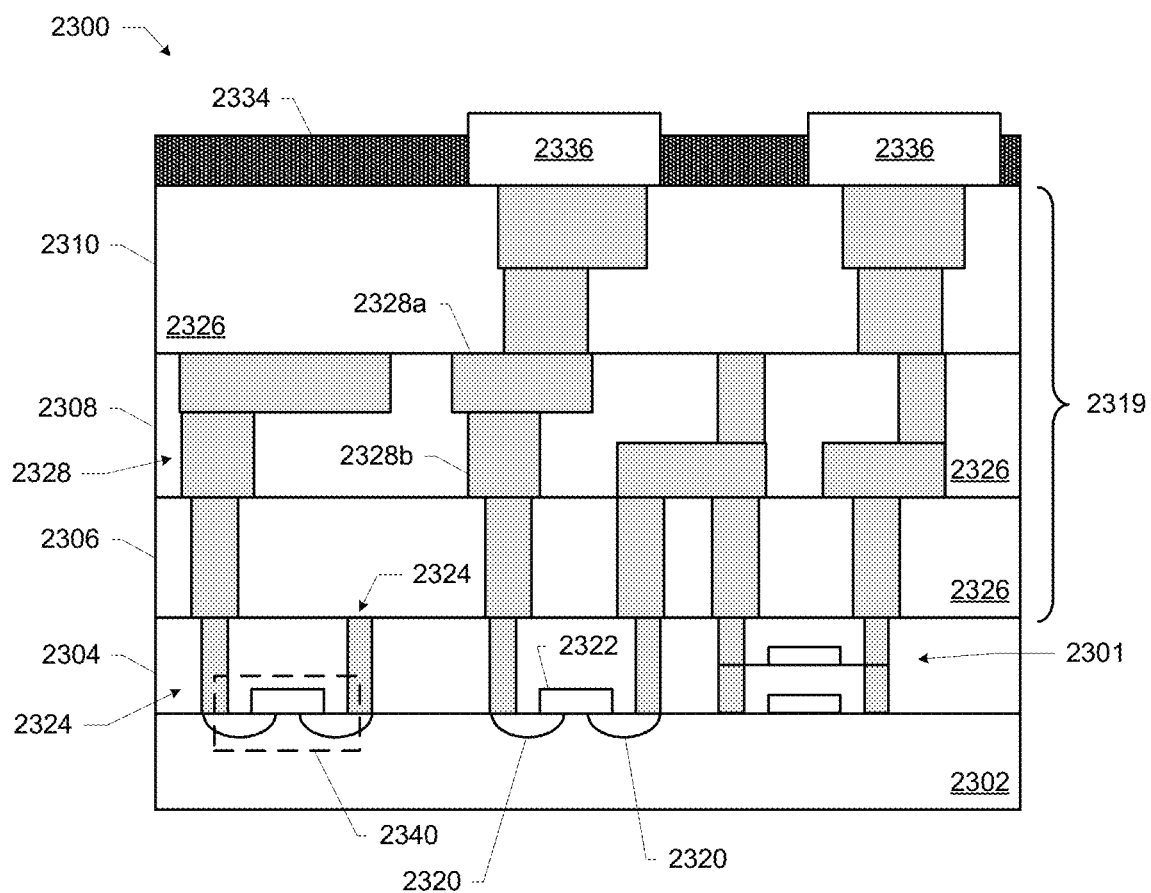
FIG. 23 is a cross-sectional side view of an IC device that may include an integrated circuit with stacked transistors, in accordance with any of the examples disclosed herein.

FIG. 23 is a cross-sectional side view of an IC device 2300 that may include one or more stacked transistors, or may be included in an IC package whose substrate includes one or more stacked transistors (e.g., as discussed below with reference to FIG. 24), in accordance with any of the examples disclosed herein. One or more of the IC devices 2300 may be included in one or more dies 2202 (FIG. 22). The IC device 2300 may be formed on a substrate 2302 (e.g., the wafer 2200 of FIG. 22) and may be included in a die (e.g., the die 2202 of FIG. 22). The substrate 2302 may be a semiconductor substrate composed of semiconductor material systems including, for example, n-type or p-type materials systems (or a combination of both). The substrate 2302 may include, for example, a crystalline substrate formed using a bulk silicon or a silicon-on-insulator (SOI) substructure. In some examples, the substrate 2302 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 2302. Although a few examples of materials from which the substrate 2302 may be formed are described here, any material that may serve as a foundation for an IC device 2300 may be used. The substrate 2302 may be part of a singulated die (e.g., the dies 2202 of FIG. 22) or a wafer (e.g., the wafer 2200 of FIG. 22).

The IC device 2300 may include one or more device layers 2304 disposed on the substrate 2302. The device layer 2304 may include features of one or more transistors 2340 (e.g., metal oxide semiconductor field-effect transistors (MOSFETs)) formed on the substrate 2302. The device layer 2304 may include, for example, one or more source and/or drain (S/D) regions 2320, a gate 2322 to control current flow in the transistors 2340 between the S/D regions 2320, and one or more S/D contacts 2324 to route electrical signals to/from the S/D regions 2320. The transistors 2340 may include additional features not depicted for the sake of clarity, such as device isolation regions, gate contacts, and the like. The transistors 2340 are not limited to the type and configuration depicted in FIG. 23 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 2340 may include a gate 2322 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 2340 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 2340 along the source-channel-drain direction, the gate electrode may consist of a U-shaped structure that includes a bottom portion substantially parallel to the surface of the substrate and two sidewall portions that are substantially perpendicular to the top surface of the substrate. In other examples, at least one of the metal layers that form the gate electrode may simply be a planar layer that is substantially parallel to the top surface of the substrate and does not include sidewall portions substantially perpendicular to the top surface of the substrate. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 2320 may be formed within the substrate 2302 adjacent to the gate 2322 of each transistor 2340. The S/D regions 2320 may be formed using an implantation/diffusion process or an etching/deposition process, for example. In the former process, dopants such as boron, aluminum, antimony, phosphorous, or arsenic may be ion-implanted into the substrate 2302 to form the S/D regions 2320. An annealing process that activates the dopants and causes them to diffuse farther into the substrate 2302 may follow the ion-implantation process. In the latter process, the substrate 2302 may first be etched to form recesses at the locations of the S/D regions 2320. An epitaxial deposition process may then be carried out to fill the recesses with material that is used to fabricate the S/D regions 2320. In some implementations, the S/D regions 2320 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 2320 may be formed using one or more alternate semiconductor materials such as germanium or a group III-V material or alloy. In further examples, one or more layers of metal and/or metal alloys may be used to form the S/D regions 2320.

In some examples, the device layer 2304 may include one or more stacked transistors, in addition to or instead of transistors 2340. FIG. 23 illustrates a single pair of stacked transistors 2301 in the device layer 2304 for illustration purposes, but any number and structure of stacked transistors may be included in a device layer 2304. Stacked transistors included in a device layer 2304 may be referred to as a "front end" device. In some examples, the IC device 2300 may not include any front end stacked transistors. One or more stacked transistors in the device layer 2304 may be coupled to any suitable other ones of the devices in the device layer 2304, to any devices in the metallization stack 2319 (discussed below), and/or to one or more of the conductive contacts 2336 (discussed below).

Electrical signals, such as power and/or input/output (I/O) signals, may be routed to and/or from the devices (e.g., transistors 2340 and/or the stacked transistors 2301) of the device layer 2304 through one or more interconnect layers disposed on the device layer 2304 (illustrated in FIG. 23 as interconnect layers 2306-2310). For example, electrically conductive features of the device layer 2304 (e.g., the gate 2322 and the S/D contacts 2324) may be electrically coupled with the interconnect structures 2328 of the interconnect layers 2306-2310. The one or more interconnect layers 2306-2310 may form a metallization stack (also referred to as an "ILD stack") 2319 of the IC device 2300. In some examples, one or more stacked transistors may be disposed in one or more of the interconnect layers 2306-2310, in accordance with any of the techniques disclosed herein. A stacked transistor included in the metallization stack 2319 may be referred to as a "back-end" device. In some examples, the IC device 2300 may not include any back-end stacked transistors; in some examples, the IC device 2300 may include both front- and back-end stacked transistors. One or more stacked transistors in the metallization stack 2319 may be coupled to any suitable ones of the devices in the device layer 2304, and/or to one or more of the conductive contacts 2336 (discussed below).

The interconnect structures 2328 may be arranged within the interconnect layers 2306-2310 to route electrical signals according to a wide variety of designs (in particular, the arrangement is not limited to the particular configuration of interconnect structures 2328 depicted in FIG. 23). Although a particular number of interconnect layers 2306-2310 is depicted in FIG. 23, examples of the present disclosure include IC devices having more or fewer interconnect layers than depicted.

In some examples, the interconnect structures 2328 may include lines 2328a and/or vias 2328b filled with an electrically conductive material such as a metal. The lines 2328a may be arranged to route electrical signals in a direction of a plane that is substantially parallel with a surface of the substrate 2302 upon which the device layer 2304 is formed. For example, the lines 2328a may route electrical signals in a direction in and out of the page from the perspective of FIG. 23. The vias 2328b may be arranged to route electrical signals in a direction of a plane that is substantially perpendicular to the surface of the substrate 2302 upon which the device layer 2304 is formed. In some examples, the vias 2328b may electrically couple lines 2328a of different interconnect layers 2306-2310 together.

The interconnect layers 2306-2310 may include a dielectric material 2326 disposed between the interconnect structures 2328, as shown in FIG. 23. In some examples, the dielectric material 2326 disposed between the interconnect structures 2328 in different ones of the interconnect layers 2306-2310 may have different compositions; in other examples, the composition of the dielectric material 2326 between different interconnect layers 2306-2310 may be the same.

A first interconnect layer 2306 (referred to as Metal 1 or "M1") may be formed directly on the device layer 2304. In some examples, the first interconnect layer 2306 may include lines 2328a and/or vias 2328b, as shown. The lines 2328*a* of the first interconnect layer 2306 may be coupled with contacts (e.g., the S/D contacts 2324) of the device layer 2304.

A second interconnect layer 2308 (referred to as Metal 2 or "M2") may be formed directly on the first interconnect layer 2306. In some examples, the second interconnect layer 2308 may include vias 2328*b* to couple the lines 2328*a* of the second interconnect layer 2308 with the lines 2328*a* of the first interconnect layer 2306. Although the lines 2328*a* and the vias 2328*b* are structurally delineated with a line within each interconnect layer (e.g., within the second interconnect layer 2308) for the sake of clarity, the lines 2328*a* and the vias 2328*b* may be structurally and/or materially contiguous (e.g., simultaneously filled during a dual-damascene process) in some examples.

A third interconnect layer 2310 (referred to as Metal 3 or "M3") (and additional interconnect layers, as desired) may be formed in succession on the second interconnect layer 2308 according to similar techniques and configurations described in connection with the second interconnect layer 2308 or the first interconnect layer 2306. In some examples, the interconnect layers that are "higher up" in the metallization stack 2319 in the IC device 2300 (i.e., further away from the device layer 2304) may be thicker.

The IC device 2300 may include a solder resist material 2334 (e.g., polyimide or similar material) and one or more conductive contacts 2336 formed on the interconnect layers 2306-2310. In FIG. 23, the conductive contacts 2336 are illustrated as taking the form of bond pads. The conductive contacts 2336 may be electrically coupled with the interconnect structures 2328 and configured to route the electrical signals of the transistor(s) 2340 to other external devices. For example, solder bonds may be formed on the one or more conductive contacts 2336 to mechanically and/or electrically couple a chip including the IC device 2300 with another component (e.g., a circuit board). The IC device 2300 may include additional or alternate structures to route the electrical signals from the interconnect layers 2306-2310; for example, the conductive contacts 2336 may include other analogous features (e.g., posts) that route the electrical signals to external components.

Figure 24:
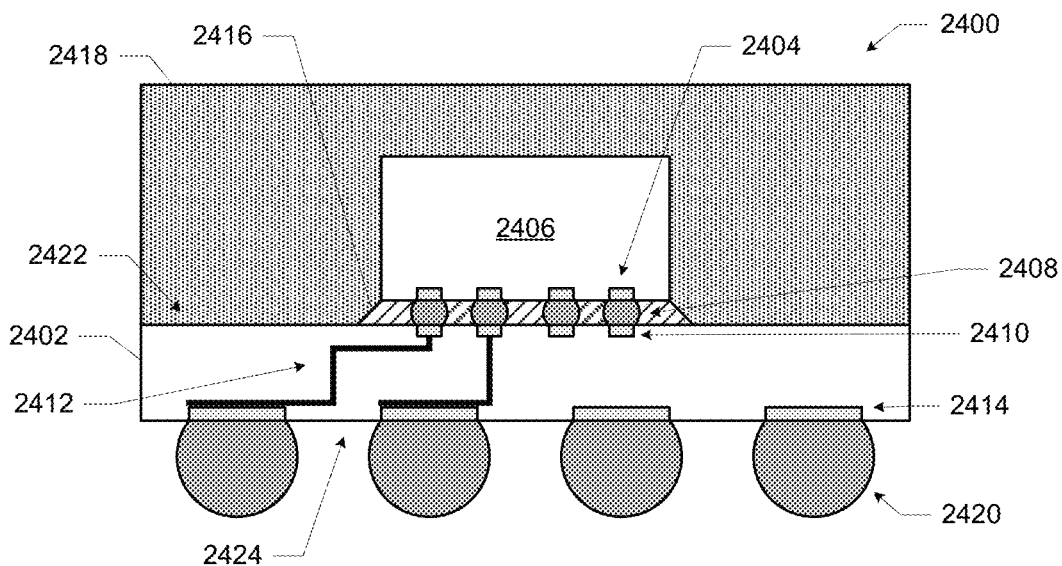
FIG. 24 is a cross-sectional side view of an IC package that may include an integrated circuit with stacked transistors, in accordance with various examples.

FIG. 24 is a cross-sectional view of an example IC package 2400 that may include one or more stacked transistors. The package substrate 2402 may be formed of a dielectric material, and may have conductive pathways extending through the dielectric material between upper and lower faces 2422, 2424, or between different locations on the upper face 2422, and/or between different locations on the lower face 2424. These conductive pathways may take the form of any of the interconnects 2328 discussed above with reference to FIG. 23. In some examples, any number of stacked transistors (with any suitable structure) may be included in a package substrate 2402. In some examples, no stacked transistors may be included in the package substrate 2402.

The IC package 2400 may include a die 2406 coupled to the package substrate 2402 via conductive contacts 2404 of the die 2406, first-level interconnects 2408, and conductive contacts 2410 of the package substrate 2402. The conductive contacts 2410 may be coupled to conductive pathways 2412 through the package substrate 2402, allowing circuitry within the die 2406 to electrically couple to various ones of the conductive contacts 2414 or to the stacked transistors (or to other devices included in the package substrate 2402, not shown). The first-level interconnects 2408 illustrated in FIG. 24 are solder bumps, but any suitable first-level interconnects 2408 may be used. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket).

In some examples, an underfill material 2416 may be disposed between the die 2406 and the package substrate 2402 around the first-level interconnects 2408, and a mold compound 2418 may be disposed around the die 2406 and in contact with the package substrate 2402. In some examples, the underfill material 2416 may be the same as the mold compound 2418. Example materials that may be used for the underfill material 2416 and the mold compound 2418 are epoxy mold materials, as suitable. Second-level interconnects 2420 may be coupled to the conductive contacts 2414. The second-level interconnects 2420 illustrated in FIG. 24 are solder balls (e.g., for a ball grid array arrangement), but any suitable second-level interconnects 2420 may be used (e.g., pins in a pin grid array arrangement or lands in a land grid array arrangement). The second-level interconnects 2420 may be used to couple the IC package 2400 to another component, such as a circuit board (e.g., a motherboard), an interposer, or another IC package, as known in the art and as discussed below with reference to FIG. 25.

In FIG. 24, the IC package 2400 is a flip chip package, and includes stacked transistors in the package substrate 2402. The number and location of stacked transistors in the package substrate 2402 of the IC package 2400 is simply illustrative, and any number of stacked transistors (with any suitable structure) may be included in a package substrate 2402. In some examples, no stacked transistors may be included in the package substrate 2402. The die 2406 may take the form of any of the examples of the die 2202 discussed herein (e.g., may include any of the examples of the IC device 2300). In some examples, the die 2406 may include one or more stacked transistors (e.g., as discussed above with reference to FIG. 22 and FIG. 23); in other examples, the die 2406 may not include any stacked transistors.

Although the IC package 2400 illustrated in FIG. 24 is a flip chip package, other package architectures may be used. For example, the IC package 2400 may be a ball grid array (BGA) package, such as an embedded wafer-level ball grid array (eWLB) package. In another example, the IC package 2400 may be a wafer-level chip scale package (WLCSP) or a panel fanout (FO) package. Although a single die 2406 is illustrated in the IC package 2400 of FIG. 24, an IC package 2400 may include multiple dies 2406 (e.g., with one or more of the multiple dies 2406 coupled to stacked transistors included in the package substrate 2402). An IC package 2400 may include additional passive components, such as surface-mount resistors, capacitors, and inductors disposed on the first face 2422 or the second face 2424 of the package substrate 2402. More generally, an IC package 2400 may include any other active or passive components known in the art.

Figure 25:
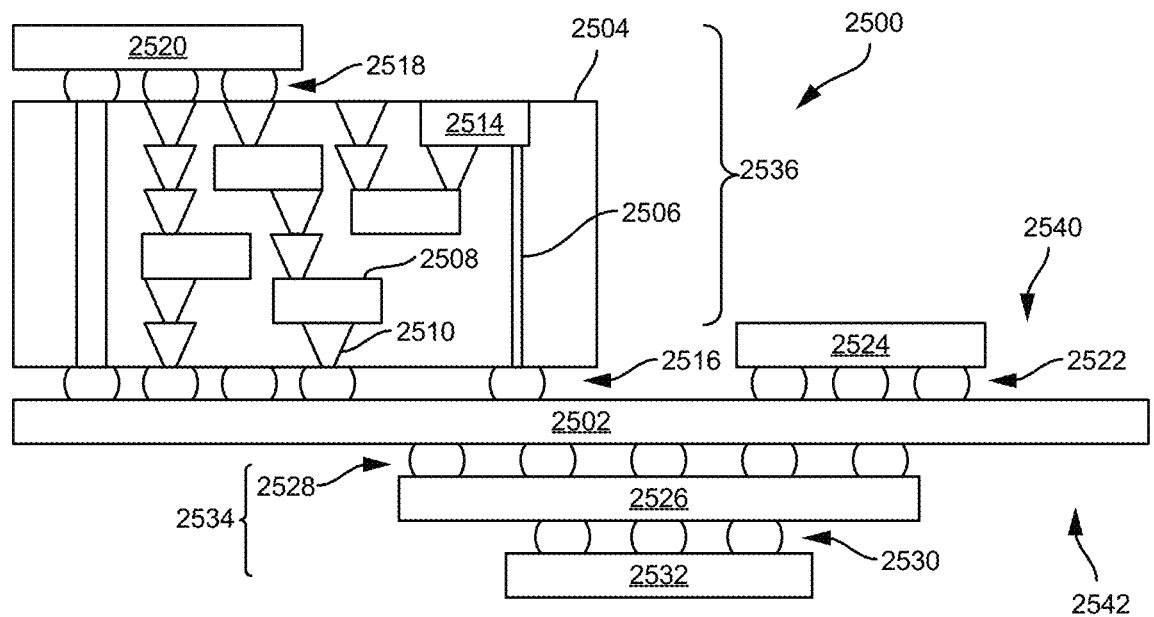
FIG. 25 is a cross-sectional side view of an IC device assembly that may include an integrated circuit with stacked transistors, in accordance with any of the examples disclosed herein.

FIG. 25 is a cross-sectional side view of an IC device assembly 2500 that may include one or more IC packages or other electronic components (e.g., a die) including one or more stacked transistors, in accordance with any of the examples disclosed herein. The IC device assembly 2500 includes a number of components disposed on a circuit board 2502 (which may be, for example, a motherboard). The IC device assembly 2500 includes components disposed on a first face 2540 of the circuit board 2502 and an opposing second face 2542 of the circuit board 2502; generally, components may be disposed on one or both faces 2540 and 2542. Any of the IC packages discussed below with reference to the IC device assembly 2500 may take the form of any of the examples of the IC package 2400 discussed above with reference to FIG. 24 (e.g., may include one or more stacked transistors in a package substrate 2402 or in a die).

In some examples, the circuit board 2502 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2502. In other examples, the circuit board 2502 may be a non-PCB substrate.

The IC device assembly 2500 illustrated in FIG. 25 includes a package-on-interposer structure 2536 coupled to the first face 2540 of the circuit board 2502 by coupling components 2516. The coupling components 2516 may electrically and mechanically couple the package-on-interposer structure 2536 to the circuit board 2502, and may include solder balls (as shown in FIG. 25), male and female portions of a socket, an adhesive, an underfill material, and/or any other suitable electrical and/or mechanical coupling structure.

The package-on-interposer structure 2536 may include an IC package 2520 coupled to an interposer 2504 by coupling components 2518. The coupling components 2518 may take any suitable form for the application, such as the forms discussed above with reference to the coupling components 2516. Although a single IC package 2520 is shown in FIG. 25, multiple IC packages may be coupled to the interposer 2504; indeed, additional interposers may be coupled to the interposer 2504. The interposer 2504 may provide an intervening substrate used to bridge the circuit board 2502 and the IC package 2520. The IC package 2520 may be or include, for example, a die (the die 2202 of FIG. 22), an IC device (e.g., the IC device 2300 of FIG. 23), or any other suitable component. Generally, the interposer 2504 may spread a connection to a wider pitch or reroute a connection to a different connection. For example, the interposer 2504 may couple the IC package 2520 (e.g., a die) to a set of BGA conductive contacts of the coupling components 2516 for coupling to the circuit board 2502. In the example illustrated in FIG. 25, the IC package 2520 and the circuit board 2502 are attached to opposing sides of the interposer 2504; in other examples, the IC package 2520 and the circuit board 2502 may be attached to a same side of the interposer 2504. In some examples, three or more components may be interconnected by way of the interposer 2504.

The interposer 2504 may be formed of an epoxy resin, a fiberglass-reinforced epoxy resin, an epoxy resin with inorganic fillers, a ceramic material, or a polymer material such as polyimide. In some examples, the interposer 2504 may be formed of alternate rigid or flexible materials that may include the same materials described above for use in a semiconductor substrate, such as silicon, germanium, and other group III-V and group IV materials. The interposer 2504 may include metal interconnects 2508 and vias 2510, including but not limited to through-silicon vias (TSVs) 2506. The interposer 2504 may further include embedded devices 2514, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 2504. The package-on-interposer structure 2536 may take the form of any of the package-on-interposer structures known in the art. In some examples, the interposer 2504 may include one or more stacked transistors.

The IC device assembly 2500 may include an IC package 2524 coupled to the first face 2540 of the circuit board 2502 by coupling components 2522. The coupling components 2522 may take the form of any of the examples discussed above with reference to the coupling components 2516, and the IC package 2524 may take the form of any of the examples discussed above with reference to the IC package 2520.

The IC device assembly 2500 illustrated in FIG. 25 includes a package-on-package structure 2534 coupled to the second face 2542 of the circuit board 2502 by coupling components 2528. The package-on-package structure 2534 may include a first IC package 2526 and a second IC package 2532 coupled together by coupling components 2530 such that the first IC package 2526 is disposed between the circuit board 2502 and the second IC package 2532. The coupling components 2528, 2530 may take the form of any of the examples of the coupling components 2516 discussed above, and the IC packages 2526, 2532 may take the form of any of the examples of the IC package 2520 discussed above. The package-on-package structure 2534 may be configured in accordance with any of the package-on-package structures known in the art.

Figure 26:
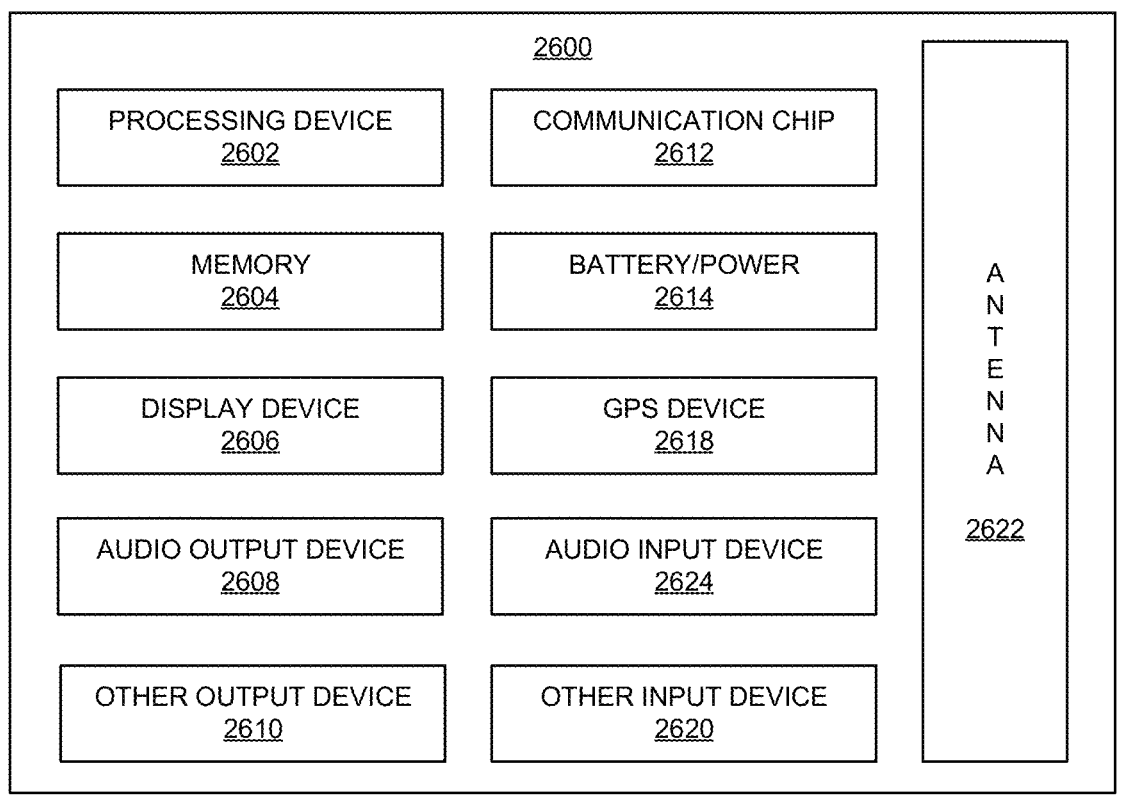
FIG. 26 is a block diagram of an example electrical device that may include an integrated circuit with stacked transistors, in accordance with any of the examples disclosed herein.

FIG. 26 is a block diagram of an example electrical device 2600 that may include one or more stacked transistors, in accordance with any of the examples disclosed herein. For example, any suitable ones of the components of the electrical device 2600 may include one or more of the IC packages 2400, IC devices 2300, or dies 2202 disclosed herein. A number of components are illustrated in FIG. 26 as included in the electrical device 2600, but any one or more of these components may be omitted or duplicated, as suitable for the application. In some examples, some or all of the components included in the electrical device 2600 may be attached to one or more motherboards. In some examples, some or all of these components are fabricated onto a single system-on-a-chip (SoC) die.

Additionally, in various examples, the electrical device 2600 may not include one or more of the components illustrated in FIG. 26, but the electrical device 2600 may include interface circuitry for coupling to the one or more components. For example, the electrical device 2600 may not include a display device 2606, but may include display device interface circuitry (e.g., a connector and driver circuitry) to which a display device 2606 may be coupled. In another set of examples, the electrical device 2600 may not include an audio input device 2624 or an audio output device 2608, but may include audio input or output device interface circuitry (e.g., connectors and supporting circuitry) to which an audio input device 2624 or audio output device 2608 may be coupled.

The electrical device 2600 may include a processing device 2602 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2602 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 2600 may include a memory 2604, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 2604 may include memory that shares a die with the processing device 2602. This memory may be used as cache memory and may include embedded dynamic random access memory (eDRAM) or spin transfer torque magnetic random access memory (STT-MRAM).

In some examples, the electrical device 2600 may include a communication chip 2612 (e.g., one or more communication chips). For example, the communication chip 2612 may be configured for managing wireless communications for the transfer of data to and from the electrical device 2600. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 2612 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2612 may operate in accordance with other wireless protocols in other examples. The electrical device 2600 may include an antenna 2622 to facilitate wireless communications and/or to receive other wireless communications (such as AM or FM radio transmissions).

In some examples, the communication chip 2612 may manage wired communications, such as electrical, optical, or any other suitable communication protocols (e.g., the Ethernet). As noted above, the communication chip 2612 may include multiple communication chips. For instance, a first communication chip 2612 may be dedicated to shorter-range wireless communications such as Wi-Fi or Bluetooth, and a second communication chip 2612 may be dedicated to longer-range wireless communications such as global positioning system (GPS), EDGE, GPRS, CDMA, WiMAX, LTE, EV-DO, or others. In some examples, a first communication chip 2612 may be dedicated to wireless communications, and a second communication chip 2612 may be dedicated to wired communications.

The electrical device 2600 may include battery/power circuitry 2614. The battery/power circuitry 2614 may include one or more energy storage devices (e.g., batteries or capacitors) and/or circuitry for coupling components of the electrical device 2600 to an energy source separate from the electrical device 2600 (e.g., AC line power).

The electrical device 2600 may include a display device 2606 (or corresponding interface circuitry, as discussed above). The display device 2606 may include any visual indicators, such as a heads-up display, a computer monitor, a projector, a touchscreen display, a liquid crystal display (LCD), a light-emitting diode display, or a flat panel display.

The electrical device 2600 may include an audio output device 2608 (or corresponding interface circuitry, as discussed above). The audio output device 2608 may include any device that generates an audible indicator, such as speakers, headsets, or earbuds.

The electrical device 2600 may include an audio input device 2624 (or corresponding interface circuitry, as discussed above). The audio input device 2624 may include any device that generates a signal representative of a sound, such as microphones, microphone arrays, or digital instruments (e.g., instruments having a musical instrument digital interface (MIDI) output).

The electrical device 2600 may include a GPS device 2618 (or corresponding interface circuitry, as discussed above). The GPS device 2618 may be in communication with a satellite-based system and may receive a location of the electrical device 2600, as known in the art.

The electrical device 2600 may include an other output device 2610 (or corresponding interface circuitry, as discussed above). Examples of the other output device 2610 may include an audio codec, a video codec, a printer, a wired or wireless transmitter for providing information to other devices, or an additional storage device.

The electrical device 2600 may include an other input device 2620 (or corresponding interface circuitry, as discussed above). Examples of the other input device 2620 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 2600 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 2600 may be any other electronic device that processes data.

From the foregoing, it will be appreciated that example integrated circuits with stacked transistors and methods of manufacturing the same have been disclosed in which the gate materials, including the gate dielectric, gate conductor, and gate contact, are deposited after the fabrication processes for all other structures associated with the stacked transistors. Depositing the gate materials after other fabrication processes avoids the concern of dielectric growth and/or work function shifts from occurring. Furthermore, leaving the deposition of the gate materials until the end of the fabrication process enables the use of processing techniques for earlier processing stages that would not otherwise be possible after the gate materials are formed because of the temperature requirements for such processes.

The following paragraphs provide various examples of the examples disclosed herein.

Example 1 is an integrated circuit that includes a first transistor in a first portion of the integrated circuit, and a second transistor stacked above the second transistor and in a second portion of the integrated circuit above the first portion. The integrated circuit further includes a bonding layer between the first and second portions of the integrated circuit. The bonding layer includes an opening extending therethrough between the first and second portions of the integrated circuit. The integrated circuit also including a gate dielectric on an inner wall of the opening.

Example 2 includes the subject matter of Example 1, wherein the bonding layer includes a first dielectric material and the gate dielectric includes a second dielectric material different than the first dielectric material.

Example 3 includes the subject matter of any one of Examples 1 or 2, wherein the gate dielectric is a high-k material.

Example 4 includes the subject matter of any one of Examples 1-3, and further includes an etch stop layer between the first portion of the integrated circuit and the bonding layer. The etch stop layer has a bottom surface facing the first portion of the integrated circuit. The gate dielectric is on the bottom surface.

Example 5 includes the subject matter of any one of Examples 1-4, and further includes a gate stack material on the inner wall of the opening. The gate dielectric is positioned between the inner wall and the gate stack material.

Example 6 includes the subject matter of any one of Examples 1-5, wherein the first transistor includes a first semiconductor fin and the second transistor includes a second semiconductor fin. The second semiconductor fin is in vertical alignment with the first semiconductor fin.

Example 7 includes the subject matter of Example 6, and further includes a first gate contact associated with the first transistor, and a second gate contact associated with the second transistor. The first and second gate contacts are electrically connected at an interface within the opening in the bonding layer.

Example 8 includes the subject matter of Example 7, and further includes a gate stack material associated with the second transistor. The interface is defined by a layer of the gate stack material between the first and second gate contacts.

Example 9 includes the subject matter of Example 7, wherein the first and second gate contacts are in contact at the interface.

Example 10 includes the subject matter of any one of Examples 7-9, wherein a first portion of the first gate contact is adjacent a first sidewall of the first semiconductor fin, and a second portion of the first gate contact is adjacent a second sidewall of the first semiconductor fin. The first portion of the first gate contact is separated from the second portion of the first gate contact to define a void between the first and second portions of the first gate contact and above the first semiconductor fin.

Example 11 is a semiconductor device that includes a first semiconductor fin associated with a first transistor, a first gate contact adjacent the first semiconductor fin, and a second semiconductor fin associated with a second transistor. The second semiconductor fin is above and in vertical alignment with the first semiconductor fin. The semiconductor device further includes a second gate contact adjacent the second semiconductor fin. The first gate contact is in vertical alignment with the second gate contact. The semiconductor device also includes an etch stop layer between the first and second transistors. The etch stop layer includes a hole in vertical alignment with the first and second gate contacts.

Example 12 includes the subject matter of Example 11, wherein the second gate contact extends below a bottom surface of the second semiconductor fin.

Example 13 includes the subject matter of any one of Examples 11 or 12, and further includes a bonding layer between the first and second semiconductor fins. The bonding layer includes an opening extending therethrough in vertical alignment with the hole in the etch stop layer.

Example 14 includes the subject matter of Example 13, wherein the first gate contact is in electrical contact with the second gate contact through the opening in the bonding layer.

Example 15 includes the subject matter of any one of Examples 13 or 14, and further includes a gate dielectric including a high-k material. The gate dielectric is on an inner wall of the opening in the bonding layer.

Example 16 includes the subject matter of Example 15, wherein the gate dielectric is positioned between the first gate contact and a bottom surface of the etch stop layer.

Example 17 includes the subject matter of any one of Examples 13-16, and further includes a first gate stack material associated with the first transistor; and a second gate stack material associated with the second transistor. The first and second gate stack materials meet at an interface within the opening of the bonding layer.

Example 18 includes the subject matter of Example 17, wherein the second gate stack material is positioned between the first and second gate contacts within the opening of the bonding layer.

Example 19 includes the subject matter of any one of Examples 11-18, wherein the first gate contact defines a void above a top surface of the first semiconductor fin.

Example 20 is a system that includes a processor circuit, a first semiconductor fin corresponding to a first transistor, and a second semiconductor fin corresponding to a second transistor. The second transistor is stacked above the first transistor. The system further includes a gate dielectric material extending continuously between the first semiconductor fin and the second semiconductor fin.

Example 21 includes the subject matter of Example 20, wherein the gate dielectric material is a high-k material.

Example 22 includes the subject matter of any one of Examples 20 or 21, and further includes a bonding layer between the first and second transistors. The gate dielectric material extends along an inner wall of an opening in the bonding layer. The opening extends through the bonding layer in a direction parallel to the first and second semiconductor fins.

Example 23 includes the subject matter of Example 22, and further includes an etch stop layer between the bonding layer and the first transistor. The etch stop layer has an underside facing the first transistor. The gate dielectric is on the underside of the etch stop layer.

Example 24 includes the subject matter of any one of Examples 22 or 23, and further includes a gate stack material extending into the opening of the bonding layer.

Example 25 includes the subject matter of any one of Examples 20-24, wherein the first semiconductor fin is in vertical alignment with the second semiconductor fin.

Example 26 includes the subject matter of any one of Examples 22-25, and further includes a first gate contact associated with the first transistor, and a second gate contact associated with the second transistor. The first and second gate contacts are electrically connected via the opening in the bonding layer.

Example 27 includes the subject matter of Example 26, and further includes a gate stack material associated with the second transistor. The gate stack material separates the first gate contact from the second gate contact.

Example 28 includes the subject matter of Example 26, wherein the first gate contact is in contact with the second gate contact.

Example 29 includes the subject matter of any one of Examples 26-28, wherein a first portion of the first gate contact is adjacent a first sidewall of the first semiconductor fin, and a second portion of the first gate contact is adjacent a second sidewall of the first semiconductor fin. The first portion of the first gate contact separated from the second portion of the first gate contact to define a void between the first and second portions of the first gate contact and above the first semiconductor fin.

Example 30 is a method of manufacturing an integrated circuit that includes forming a first semiconductor fin associated with a first transistor. and forming a second semiconductor fin associated with a second transistor. The second semiconductor fin is vertically above the first semiconductor fin. The method further includes depositing a gate contact adjacent the first semiconductor fin after formation of the second semiconductor fin.

Example 31 includes the subject matter of Example 30, and further includes forming a sacrificial gate material associated with the first transistor before the formation of the second semiconductor fin, and removing the sacrificial gate material after the formation of the second semiconductor fin. The gate contact is deposited in gaps produced by the removal of the sacrificial gate material.

Example 32 includes the subject matter of any one of Examples 30 or 31, and further includes attaching a block of semiconductor material above the first transistor via a bonding layer, and forming the second semiconductor fin out of the block of semiconductor material.

Example 33 includes the subject matter of Example 32, and further includes: forming a first sacrificial gate material associated with the first transistor before the formation of the second semiconductor fin; forming a second sacrificial gate material associated with the second transistor after the formation of the second semiconductor fin; removing the second sacrificial gate material; and etching an opening through the bonding layer to define a path to the first sacrificial gate material.

Example 34 includes the subject matter of Example 33, and further includes removing the first sacrificial gate material via the opening in the bonding layer.

Example 35 includes the subject matter of Example 34, and further includes depositing a protective coating on exposed surfaces of the second semiconductor fin before the removing of the first sacrificial gate material. The exposed surfaces of the second semiconductor fin are exposed by the removing of the second sacrificial gate material.

Example 36 includes the subject matter of any one of Examples 34 or 35, and further includes depositing a high-k material on surfaces exposed by the removing of the first and second sacrificial gate materials. The high-k material to line an inner wall of the opening in the bonding layer.

Example 37 includes the subject matter of Example 36, and further includes depositing a gate stack material on exposed surfaces of the high-k material, and depositing the gate contact on the gate stack material adjacent the first semiconductor fin.

Example 38 includes the subject matter of any one of Examples 34-37, wherein the gate contact is a first gate contact. The method further includes depositing the first gate contact adjacent the first semiconductor fin via the opening in the bonding layer, and depositing a second gate contact adjacent the second semiconductor fin. The second gate contact is to extend into the opening in the bonding layer to electrically connect with the first gate contact positioned within the opening in the bonding layer.

Example 39 includes the subject matter of Example 38, and further includes depositing a gate stack material before depositing the second gate contact. The gate stack material is to cover a top surface of the first gate contact.

Example 40 includes the subject matter of Example 39, and further includes removing the gate stack material covering the top surface of the first gate contact before depositing the second gate contact.

Example 41 is an integrated circuit manufactured by a process that includes forming a first semiconductor fin associated with a first transistor, and forming a second semiconductor fin associated with a second transistor. The second semiconductor fin is vertically above the first semiconductor fin. The process further includes depositing a gate contact adjacent the first semiconductor fin after formation of the second semiconductor fin.

Example 42 includes the subject matter of Example 41, wherein the process further includes forming a sacrificial gate material associated with the first transistor before the formation of the second semiconductor fin, and removing the sacrificial gate material after the formation of the second semiconductor fin. The gate contact is deposited in gaps produced by the removal of the sacrificial gate material.

Example 43 includes the subject matter of any one of Examples 41 or 42, wherein the process further includes forming the second semiconductor fin out of a block of semiconductor material attached above the first transistor via a bonding layer.

Example 44 includes the subject matter of Example 43, wherein the process further includes forming a first sacrificial gate material associated with the first transistor before the formation of the second semiconductor fin, and forming a second sacrificial gate material associated with the second transistor after the formation of the second semiconductor fin. The process also includes removing the second sacrificial gate material, and etching an opening through the bonding layer to define a path to the first sacrificial gate material.

Example 45 includes the subject matter of Example 44, wherein the process further includes removing the first sacrificial gate material via the opening in the bonding layer.

Example 46 includes the subject matter of Example 45, wherein the process further includes depositing a protective coating on exposed surfaces of the second semiconductor fin before the removing of the first sacrificial gate material. The exposed surfaces of the second semiconductor fin are exposed by the removing of the second sacrificial gate material.

Example 47 includes the subject matter of any one of Examples 45 or 46, wherein the process further includes depositing a high-k material on surfaces exposed by the removing of the first and second sacrificial gate materials. The high-k material is to line an inner wall of the opening in the bonding layer.

Example 48 includes the subject matter of Example 47, wherein the process further includes depositing a gate stack material on exposed surfaces of the high-k material, and depositing the gate contact on the gate stack material adjacent the first semiconductor fin.

Example 49 includes the subject matter of any one of Examples 45-48, wherein the gate contact is a first gate contact. The process further includes depositing the first gate contact adjacent the first semiconductor fin via the opening in the bonding layer, and depositing a second gate contact adjacent the second semiconductor fin. The second gate contact is to extend into the opening in the bonding layer to electrically connect with the first gate contact positioned within the opening in the bonding layer.

Example 50 includes the subject matter of Example 49, wherein the process further includes depositing a gate stack material before depositing the second gate contact. The gate stack material is to cover a top surface of the first gate contact.

Example 51 includes the subject matter of Example 50, wherein the process further includes removing the gate stack material covering the top surface of the first gate contact before depositing the second gate contact.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An integrated circuit, comprising:
a first transistor in a first portion of the integrated circuit;
a second transistor stacked above the first transistor and in a second portion of the integrated circuit above the first portion;
a bonding layer between the first and second portions;
a second layer between the first portion and the bonding layer, the bonding layer and the second layer comprising openings extending through the bonding layer and the second layer between the first and second portions, the second layer comprising a bottom surface facing the first portion; and
a gate dielectric on an inner wall of the openings and directly on a bottom surface of the second layer.

2. The integrated circuit of claim 1, wherein the bonding layer comprises a first dielectric material and the gate dielectric comprises a second dielectric material different than the first dielectric material.

3. The integrated circuit of claim 1, wherein the gate dielectric comprises a high-k material.

4. The integrated circuit of claim 1, further comprising a gate stack material over the gate dielectric and adjacent the inner wall of the openings.

5. The integrated circuit of claim 1, wherein the first transistor comprises a first semiconductor fin and the second transistor comprises a second semiconductor fin, the second semiconductor fin in vertical alignment with the first semiconductor fin.

6. The integrated circuit of claim 5, further comprising:
a first gate contact associated with the first transistor; and
a second gate contact associated with the second transistor, the first and second gate contacts connected at an interface within the opening in the bonding layer.

7. The integrated circuit of claim 6, further comprising a gate stack material associated with the second transistor, the interface comprising a layer of the gate stack material between the first and second gate contacts.

8. The integrated circuit of claim 6, wherein the first and second gate contacts are in contact at the interface.

9. The integrated circuit of claim 6, wherein a first portion of the first gate contact is adjacent a first sidewall of the first semiconductor fin, a second portion of the first gate contact is adjacent a second sidewall of the first semiconductor fin, the first portion of the first gate contact separated from the second portion of the first gate contact to define a void between the first and second portions of the first gate contact and above the first semiconductor fin.

10. A semiconductor device, comprising:
a first semiconductor fin associated with a first transistor;
a first gate contact adjacent the first semiconductor fin;
a second semiconductor fin associated with a second transistor, the second semiconductor fin above and in vertical alignment with the first semiconductor fin;
a second gate contact adjacent the second semiconductor fin, the first gate contact in vertical alignment with the second gate contact, wherein the second gate contact extends below a bottom surface of the second semiconductor fin;
a layer between the first and second transistors, the layer comprising an opening in vertical alignment with the first and second gate contacts; and
a gate dielectric on an inner wall of the opening in the layer.

11. The semiconductor device of claim 10, wherein the layer comprises an etch stop layer and a bonding layer adjacent the etch stop layer, the opening extending through the etch stop layer and the bonding layer.

12. The semiconductor device of claim 10, wherein the first gate contact is in contact with the second gate contact within the opening in the layer.

13. The semiconductor device of claim 10, wherein the gate dielectric comprises a high-k material.

14. A method of manufacturing an integrated circuit, comprising:
forming a first semiconductor fin and a first sacrificial gate material associated with a first transistor;
forming a second semiconductor fin and a second sacrificial gate material associated with a second transistor, wherein the second semiconductor fin is vertically above the first semiconductor fin and forming the second semiconductor fin comprises attaching a block of semiconductor material above the first transistor via a bonding layer and forming the second semiconductor fin out of the block of semiconductor material;
removing the second sacrificial gate material;
depositing a protective coating on exposed surfaces of the second semiconductor fin exposed by said removing the second sacrificial gate material;
etching an opening through the bonding layer to define a path to the first sacrificial gate material;
removing the first sacrificial gate material via the opening in the bonding layer; and
depositing a gate contact adjacent the first semiconductor fin.

15. The method of claim 14, further comprising depositing a dielectric material on surfaces exposed by said removing the first and second sacrificial gate materials, the dielectric material to line an inner wall of the opening in the bonding layer.

16. A semiconductor device, comprising:
a first semiconductor fin associated with a first transistor;
a first gate contact adjacent the first semiconductor fin;
a second semiconductor fin associated with a second transistor, the second semiconductor fin above and in vertical alignment with the first semiconductor fin;
a second gate contact adjacent the second semiconductor fin, the first gate contact in vertical alignment with the second gate contact;
a layer between the first and second transistors, the layer comprising an opening in vertical alignment with the first and second gate contacts, wherein the layer comprises an etch stop layer and a bonding layer adjacent the etch stop layer, the opening extending through the etch stop layer and the bonding layer; and
a gate dielectric on an inner wall of the opening in the layer.

17. The semiconductor device of claim 16, wherein the second gate contact extends below a bottom surface of the second semiconductor fin.

18. The semiconductor device of claim 16, wherein the first gate contact is in contact with the second gate contact within the opening in the layer.

19. The semiconductor device of claim 16, wherein the gate dielectric comprises a high-k material.

\* \* \* \* \*